(12) United States Patent
Tsumita et al.

(10) Patent No.: US 11,056,641 B2
(45) Date of Patent: Jul. 6, 2021

(54) SPIN-ORBIT-TORQUE MAGNETIZATION ROTATIONAL ELEMENT, SPIN-ORBIT-TORQUE MAGNETORESISTANCE EFFECT ELEMENT, AND MAGNETIC MEMORY

(71) Applicant: TDK CORPORATION, Tokyo (JP)

(72) Inventors: Atsushi Tsumita, Tokyo (JP); Yohei Shiokawa, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/578,714

(22) Filed: Sep. 23, 2019

(65) Prior Publication Data
US 2020/0136023 A1  Apr. 30, 2020

(30) Foreign Application Priority Data
Oct. 31, 2018 (JP) ............... JP2018-205812

(51) Int. Cl.
*H01L 43/04* (2006.01)
*H01L 27/22* (2006.01)
(Continued)

(52) U.S. Cl.
CPC ............ *H01L 43/04* (2013.01); *G11C 11/161* (2013.01); *G11C 11/18* (2013.01); *H01F 10/329* (2013.01);
(Continued)

(58) Field of Classification Search
CPC ....... H01L 43/04; H01L 43/10; H01L 27/222; G11C 11/161; G11C 11/18; H01F 10/3254; H01F 10/329
(Continued)

(56) References Cited

U.S. PATENT DOCUMENTS 6,765,823 B1 * 7/2004 Zhu .................. G11C 11/15
257/E27.005
8,350,347 B2   1/2013 Gaudin et al.
(Continued)

FOREIGN PATENT DOCUMENTS

JP   2017-112358 A   6/2017
JP   2017-216286 A   12/2017
(Continued)

OTHER PUBLICATIONS

Manuel Baumgartner et al.; "Time- and spatially-resolved magnetization dynamics drive by spin-orbit torques;" Nature Nanotechnology; 2017; pp. 980-986; vol. 12.
(Continued)

*Primary Examiner* — Tong-Ho Kim
(74) *Attorney, Agent, or Firm* — Oliff PLC

(57) ABSTRACT

A spin-orbit-torque magnetization rotational element includes: a first ferromagnetic layer; and a spin-orbit torque wiring in which a first surface faces the first ferromagnetic layer and a long axis extends in a first direction when viewed in plan view from a lamination direction of the first ferromagnetic layer, wherein the first surface spreads along a reference plane orthogonal to the lamination direction of the first ferromagnetic layer, the spin-orbit torque wiring contains a first virtual cross-section which passes through a first end of the first ferromagnetic layer in the first direction and is orthogonal to the first direction and a second virtual cross-section which passes through a second end of the first ferromagnetic layer in the first direction and is orthogonal to the first direction, and an area of the first virtual cross-section is different from an area of the second virtual cross-section.

15 Claims, 10 Drawing Sheets

(51) Int. Cl.
  *G11C 11/16* (2006.01)
  *H01F 10/32* (2006.01)
  *G11C 11/18* (2006.01)
  *H01L 43/10* (2006.01)
(52) U.S. Cl.
  CPC ....... *H01F 10/3254* (2013.01); *H01L 27/222* (2013.01); *H01L 43/10* (2013.01)
(58) Field of Classification Search
  USPC .......................................................... 257/421
  See application file for complete search history.

(56) References Cited

U.S. PATENT DOCUMENTS

| 2015/0348606 | A1 | 12/2015 | Buhrman et al. |
| 2017/0117323 | A1 | 4/2017 | Braganca et al. |
| 2017/0222135 | A1 | 8/2017 | Fukami et al. |
| 2018/0033953 | A1* | 2/2018 | Sasaki .................... H01L 43/10 |

FOREIGN PATENT DOCUMENTS

| JP | 2018-026525 A | 2/2018 |
| WO | 2016/021468 A1 | 2/2016 |

OTHER PUBLICATIONS

Y.K. Kato etal.; "Observation of the Spin Hall Effect in Semiconductors;" Science; Dec. 10, 2004; pp. 1910-1913; vol. 306.

Ioan Mihai Miron et. al; "Perpendicular switching of a single ferromagnetic layer induced by in-plane current injection;" Aug. 11, 2011; pp. 189-194; vol. 476.

Luqiau Liu et. al.; "Spin torque switching with the giant spin Hall effect of tantalum;" Science, 2012; 555; vol. 336, 32 pages.

Luqiao Liu et. al.; "Current-Induced Switching of Perpendicularly Magnetized Magnetic Layers Using Spin Torque from the Spin Hall Effect;" Physical Review Letters; Aug. 31, 2012; pp. 096602-1-096602-5; vol. 109.

Ki-Seung Lee et. al.; "Threshold current for switching of a perpendicular magnetic layer induced by spin Hall effect;" Applied Physics Letters; 112410; vol. 102, 18 pages.

Ki-Seung Lee et. al.; Thermally activated switching of perpendicular magnet by spin-orbit spin torque; Applied Physics Letters; Feb. 21, 2014; pp. 072413-1-072413-5; vol. 104.

Shunsuke Fukami et. al.; "Magnetization switching by spin-orbit torque in an antiferromagnet-ferromagnet bilayer system;" Nature Materials; 2016; pp. 535-542; vol. 15.

Shunsuke Fukami et. al.; "A spin-orbit torque switching scheme with collinear magnetic easy axis and current configuration;" Nature Nanotechnology; Mar. 21, 2016; 621; vol. 11, 6 pages.

S. Takahashi et. al.; "Spin injection and detection in magnetic nanostructures;" Physical Review B; Feb. 28, 2003; pp. 052409-1-052409-4; vol. 67.

Yeongkyo Seo et. al.; "Area-Efficient SOT-MRAM With a Schottky Diode;" IEEE Electronic Device Letters; Aug. 2016; pp. 982-985; vol. 37; Issue 8.

Wei Zhang et al.; "Spin Hall Effects in Metallic Antiferromagnets;" Physical Review Letters; Nov. 7, 2014; pp. 196602-1-196602-6; vol. 113.

* cited by examiner

SPIN-ORBIT-TORQUE MAGNETIZATION ROTATIONAL ELEMENT, SPIN-ORBIT-TORQUE MAGNETORESISTANCE EFFECT ELEMENT, AND MAGNETIC MEMORY

BACKGROUND OF THE INVENTION

Field of the Invention

The disclosure relates to a spin-orbit-torque magnetization rotational element, a spin-orbit-torque magnetoresistance effect element, and a magnetic memory. Priority is claimed on Japanese Patent Application No. 2018-205812, filed Oct. 31, 2018, the content of which is incorporated herein by reference.

Description of Related Art

Giant magnetoresistance (GMR) elements formed of multilayer films including ferromagnetic layers and non-magnetic layers, and tunneling magnetoresistance (TMR) elements using insulating layers (tunnel barrier layers or barrier layers) as non-magnetic layers are known as magnetoresistance effect elements. Magnetoresistance effect elements can be applied to magnetic sensors, high-frequency components, magnetic heads, and nonvolatile random-access memories (MRAMs).

MRAMs are storage elements having magnetoresistance effect elements integrated therein. In an MRAM, data is read and written using characteristics in which a resistance of a magnetoresistance effect element changes when magnetization directions of two ferromagnetic layers having a non-magnetic layer disposed therebetween in the magnetoresistance effect element change. A magnetization direction of a ferromagnetic layer is controlled, for example, using a magnetic field generated due to a current. Furthermore, for example, a magnetization direction of a ferromagnetic layer is controlled using a spin-transfer torque (STT) occurring when a current flows in a lamination direction of a magnetoresistance effect element.

When a magnetization direction of a ferromagnetic layer is rewritten using an STT, a current flows in a lamination direction of a magnetoresistance effect element. A write current causes the characteristic deterioration of a magnetoresistance effect element.

In recent years, attention has been paid to methods in which a current may not be required to flow in a lamination direction of a magnetoresistance effect element at the time of writing. One such method is a writing method using a spin-orbit torque (SOT) (for example, Non-Patent Document 1). An SOT is induced due to a spin current generated due to a spin-orbit interaction or a Rashba effect at an interface between different materials. A current for inducing an SOT in a magnetoresistance effect element flows in a direction which intersects a lamination direction of the magnetoresistance effect element. That is to say, it is not necessary for a current to flow in the lamination direction of the magnetoresistance effect element and such a magnetoresistance effect element is expected to have a long lifespan.

Also, Non-Patent Document 1 describes temporal and spatial behaviors of magnetization reversal using an SOT.

PATENT DOCUMENTS

[Patent Document 1] Japanese Unexamined Patent Application, First Publication No. 2017-216286

[Non-Patent Document 1] Manuel Baumgartner et al., "Time- and spatially-resolved magnetization dynamics driven by spin-orbit torques" Nat. Nanotech., 12, 980 to 986 (2017).

SUMMARY OF THE INVENTION

Non-Patent Document 1 describes that a start point of magnetization reversal fluctuates in accordance with a direction of an external magnetic field applied to a ferromagnetic layer, a direction of a current flowing in a spin-orbit torque wiring adjacent to a ferromagnetic layer, or the like.

The fluctuation of the start point of the magnetization reversal does not matter if the ease of magnetization reversal (the stability of the magnetization) is constant at any place in the ferromagnetic layer. However, in real devices which are mass-produced or the like, the ease of magnetization reversal may differ for each position in the ferromagnetic layer due to manufacturing variations and the like in some cases. In this case, a temporal and spatial behavior of the magnetization reversal may differ between a case in which the magnetization reversal starts from an arbitrary point A in the ferromagnetic layer and a case in which the magnetization reversal starts from a point B different from the point A in some cases. That is to say, even when the same energy is applied to the ferromagnetic layer, in a case in which magnetization reversal starts from a specific start point, the magnetization reversal may appropriately propagate, but the magnetization reversal may not propagate appropriately when the magnetization reversal starts from another start point in some cases. Therefore, the fluctuation of the start point of the magnetization reversal can contribute to a decrease in reliability of a magnetoresistance effect element.

The disclosure was made in view of the above circumstances, and an object of the disclosure is to provide a spin-orbit-torque magnetization rotational element, a spin-orbit-torque magnetoresistance effect element, and a magnetic memory in which behaviors of magnetization reversal are unified and which have high reliability.

The disclosure provides the following means to accomplish the above object.

(1) A spin-orbit-torque magnetization rotational element according to a first aspect includes: a first ferromagnetic layer; and a spin-orbit torque wiring in which a first surface faces the first ferromagnetic layer and a long axis extends in a first direction when viewed in plan view from a lamination direction of the first ferromagnetic layer, wherein the first surface spreads along a reference plane orthogonal to the lamination direction of the first ferromagnetic layer, the spin-orbit torque wiring contains a first virtual cross-section which passes through a first end of the first ferromagnetic layer in the first direction and is orthogonal to the first direction and a second virtual cross-section which passes through a second end of the first ferromagnetic layer in the first direction and is orthogonal to the first direction, and an area of the first virtual cross-section is different from an area of the second virtual cross-section.

(2) In the spin-orbit-torque magnetization rotational element according to the aspect, widths of the spin-orbit torque wiring in a second direction orthogonal to the first direction may be different in the first virtual cross-section and the second virtual cross-section when viewed in plan view from the lamination direction of the first ferromagnetic layer.

(3) In the spin-orbit-torque magnetization rotational element according to the aspect, thicknesses of the spin-orbit torque wiring may be different in the first virtual cross-section and the second virtual cross-section.

(4) The first ferromagnetic layer may have a narrow width portion whose width in the second direction orthogonal to the first direction is locally narrower between the first end and the second end when viewed in plan view from the lamination direction of the first ferromagnetic layer of the spin-orbit-torque magnetization rotational element according to the above aspect.

(5) In the spin-orbit-torque magnetization rotational element according to the aspect, a plurality of the narrow width portions may be provided between the first end and the second end.

(6) A spin-orbit-torque magnetoresistance effect element according to a second aspect includes: the spin-orbit-torque magnetization rotational element according to the above aspect; a magnetization fixed layer located on a side of the first ferromagnetic layer opposite to the spin-orbit torque wiring; and a first non-magnetic layer located between the magnetization fixed layer and the first ferromagnetic layer.

(7) The spin-orbit-torque magnetoresistance effect element according to the above aspect may further include: a magnetic field application mechanism for applying a magnetic field from the first end toward the second end when the area of the first virtual cross-section is larger than the area of the second virtual cross-section and applying a magnetic field from the second end toward the first end when the area of the first virtual cross-section is smaller than the area of the second virtual cross-section.

(8) In the spin-orbit-torque magnetoresistance effect element according to the above aspect, the magnetization fixed layer may have a second ferromagnetic layer, a second non-magnetic layer, and a third ferromagnetic layer in this order from a position close to the first ferromagnetic layer, a product of a saturation magnetization and a volume of the second ferromagnetic layer may be larger than a product of a saturation magnetization and a volume of the third ferromagnetic layer, orientation directions of the magnetizations in the second ferromagnetic layer and the third ferromagnetic layer may be opposite to each other, and the magnetization fixed layer may apply a magnetic field from the second end toward the first end to the first ferromagnetic layer.

(9) In the spin-orbit-torque magnetoresistance effect element according to the above aspect, the spin-orbit torque wiring may have a spin Hall angle which has a positive polarity, and the spin-orbit torque wiring may mainly include any metal element selected from the group consisting of those of Groups 8, 9, 10, 11, and 12.

(10) In the spin-orbit-torque magnetoresistance effect element according to the above aspect, the magnetization fixed layer may have a second ferromagnetic layer, a second non-magnetic layer, and a third ferromagnetic layer in this order from a position close to the first ferromagnetic layer, a product of a saturation magnetization and a volume of the second ferromagnetic layer may be smaller than a product of a saturation magnetization and a volume of the third ferromagnetic layer, orientation directions of the magnetizations of the second ferromagnetic layer and the third ferromagnetic layer may be opposite to each other, and the magnetization fixed layer may apply a magnetic field from the first end toward the second end to the first ferromagnetic layer.

(11) In the spin-orbit-torque magnetoresistance effect element according to the above aspect, the spin-orbit torque wiring may have a spin Hall angle which has a negative polarity, and the spin-orbit torque wiring may mainly include any metal element selected from the group consisting of those of Groups 3, 4, 5, and 6.

(12) A magnetic memory according to a third aspect includes: a plurality of the spin-orbit-torque magnetoresistance effect elements according to the above aspect.

According to the spin-orbit-torque magnetization rotational element, the spin-orbit-torque magnetoresistance effect element, and the magnetic memory according to this embodiment, the reliability of an element can be enhanced.

DETAILED DESCRIPTION OF THE INVENTION

Embodiments will be described in detail below with reference to the drawings as appropriate. The drawings used in the following description sometimes show enlarged characteristic portions for the sake of convenience and in order to make the features easier to understand, and the dimensional proportions or the like of each component may be different from actual ones. Although materials, dimensions, and the like exemplified in the following description are merely examples, the disclosure is not limited thereto, and the disclosure can be realized by appropriately modifying these within a range in which the effects of the disclosure are achieved.

First Embodiment (Spin-Orbit-Torque Magnetization Rotational Element)

Figure 1:
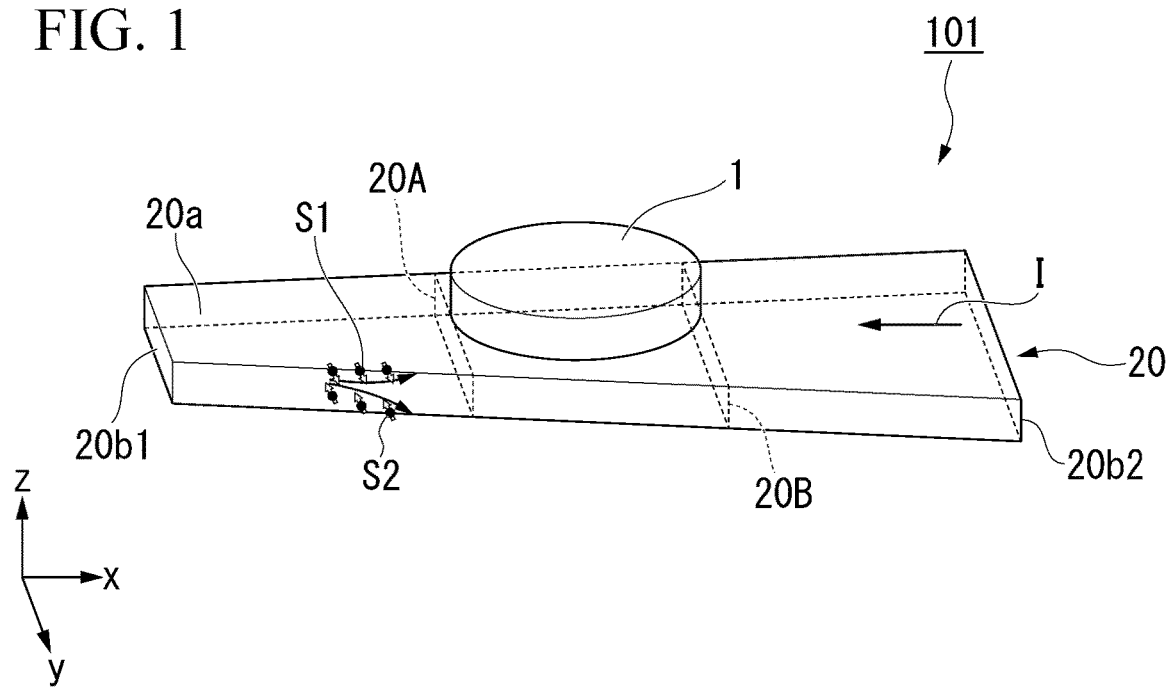
FIG. 1 is a perspective view of a spin-orbit-torque magnetization rotational element according to a first embodiment.
Figure 2:
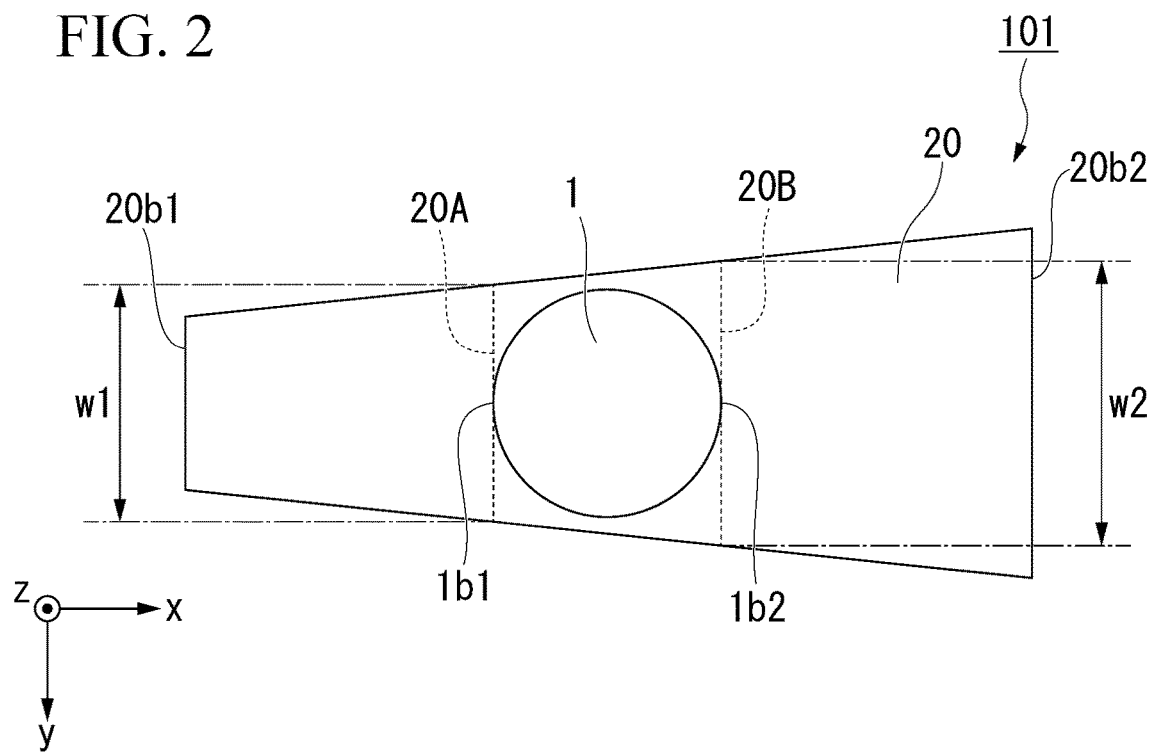
FIG. 2 is a plan view of the spin-orbit-torque magnetization rotational element according to the first embodiment.

FIG. 1 is a perspective view of a spin-orbit-torque magnetization rotational element 101 according to a first embodiment. FIG. 2 is a plan view of the spin-orbit-torque magnetization rotational element 101 according to the first embodiment. The spin-orbit-torque magnetization rotational element 101 includes a first ferromagnetic layer 1 and a spin-orbit torque wiring 20.

First, directions are defined. A z direction is a direction substantially orthogonal to a substrate which is a support of the spin-orbit-torque magnetization rotational element 101 and a lamination direction of the first ferromagnetic layer 1. An x direction is a direction which corresponds to a long axis of the spin-orbit torque wiring 20 when viewed in plan view from the z direction. A y direction is a direction intersecting (for example, substantially orthogonal to) the x direction and the z direction. The x direction is an example of a first direction. The y direction is an example of a second direction. The z direction is an example of a lamination direction. An xy plane is an example of a reference plane. Hereinafter, a +z direction may be expressed as "an upward direction" and a -z direction may be expressed as "a downward direction" in some cases. The upward and downward directions do not necessarily coincide with a direction in which a force of gravity is applied.

<First Ferromagnetic Layer>

The first ferromagnetic layer 1 is laminated above the spin-orbit torque wiring 20. The first ferromagnetic layer 1 may be directly connected to the spin-orbit torque wiring 20 or may be connected to the spin-orbit torque wiring 20 with another layer therebetween.

The first ferromagnetic layer 1 contains a ferromagnetic material, particularly, a soft magnetic material. Examples of the ferromagnetic material include a metal selected from the group consisting of Cr, Mn, Co, Fe, and Ni, an alloy containing one or more of these metals, an alloy containing at least one of these metals and at least one element from B, C, and N, and the like. Examples of the ferromagnetic material include Co—Fe, Co—Fe—B, Ni—Fe, a Co—Ho alloy, an Sm—Fe alloy, an Fe—Pt alloy, a Co—Pt alloy, and a CoCrPt alloy.

The first ferromagnetic layer 1 may contain a Heusler alloy such as $Co_2FeSi$. The Heusler alloy contains an intermetallic compound having a chemical composition of XYZ or $X_2YZ$, where X represents a Co-, Fe-, or Ni-, Cu-group transition metal element or noble metal element in the periodic table, Y represents a Mn-, V-, Cr-, or Ti-group transition metal or an element of the X type in the periodic table, and Z represents a typical element from Group III to Group V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like. The Heusler alloy has a high spin polarization.

The first ferromagnetic layer 1 illustrated in FIG. 2 is circular when viewed in plan view from the z direction. A shape of the first ferromagnetic layer 1 when viewed in plan view is not limited to a circle. The first ferromagnetic layer 1 may have shape anisotropy when viewed in plan view. The shape of the first ferromagnetic layer 1 when viewed in plan view may be, for example, a quadrangle, an ellipse which will be described later, an irregular shape which will be described later, or the like.

The magnetization of the first ferromagnetic layer 1 is oriented in any direction in the xy plane or in the z direction. When the magnetization of the first ferromagnetic layer 1 is oriented in any direction in the xy plane, the first ferromagnetic layer 1 is referred to as an in-plane magnetization film. When the magnetization of the first ferromagnetic layer 1 is oriented in the z direction, the first ferromagnetic layer 1 is referred to as a perpendicular magnetization film.

<Spin-orbit Torque Wiring>

The spin-orbit torque wiring 20 is present in the xy plane and has a long axis in the x direction. The spin-orbit torque wiring 20 extends in the x direction. A first surface 20a of the spin-orbit torque wiring 20 spreads along the xy plane. The first surface 20a is substantially parallel to the xy plane.

The spin-orbit torque wiring 20 generates a spin current due to a spin Hall effect when a current I flows therethrough. A spin Hall effect is a phenomenon in which, when a current I flows through a wiring, a spin current is induced in a direction orthogonal to a direction in which the current I flows on the basis of a spin-orbit interaction. The spin-orbit torque wiring 20 generates a spin-orbit torque (SOT) sufficient to reverse the magnetization of the first ferromagnetic layer 1 in the first ferromagnetic layer 1.

When a potential difference is applied to both ends of the spin-orbit torque wiring 20, a current I flows through the spin-orbit torque wiring 20. First spins S1 oriented in one direction and second spins S2 oriented in a direction opposite to that of the first spins S1 are bent in directions orthogonal to the current. For example, the first spins S1 oriented in a +y direction are bent in the +z direction and the second spins S2 oriented in a -y direction are bent in the -z direction.

A normal Hall effect and a spin Hall effect are the same in that a moving (traveling) direction of moving (traveling) charges (electrons) can be bent. On the other hand, a normal Hall effect and a spin Hall effect significantly differ in that, in a normal Hall effect, charged particles moving in a magnetic field are subjected to a Lorentz force and thus a moving direction of the charged particles is bent, whereas in a spin Hall effect, as long as electrons travel (a current flows) even when no magnetic field is present, a traveling direction of spins is bent.

The number of electrons of the first spins S1 and the number of electrons of the second spins S2 generated due to a spin Hall effect are the same in a non-magnetic material (a material which is not a ferromagnetic material). In FIG. 1, the number of electrons of the first spins S1 directed in the +z direction is equal to the number of electrons of the second spins S2 directed in the -z direction. In this case, flows of charges cancel each other out and an amount of current is zero. A spin current which does not involve this current is particularly referred to as a pure spin current.

If an electron flow of the first spins Si is represented by $J_\uparrow$, an electron flow of the second spins S2 is represented by $J_\downarrow$, and a spin current is represented by $J_S$, $J_S=J_\uparrow-J_\downarrow$ is defined. The spin current Js generates in the z direction. In FIG. 1, the spin-orbit torque wiring 20 faces the first ferromagnetic layer 1. Spins are injected from the spin-orbit torque wiring 20 into the first ferromagnetic layer 1. The injected spins give a spin-orbit torque (SOT) to the magnetization of the first ferromagnetic layer 1. The magnetization of the first ferromagnetic layer 1 is subjected to magnetization reversal due to this SOT.

Directions in which the first spins S1 and the second spins S2 are bent (±z directions with respect to traveling directions thereof) are determined using "the polarity of a spin Hall angle" of the spin-orbit torque wiring 20. The first spins S1 bent in the z direction are assumed to have a positive polarity and the first spins S1 bent in the −z direction are assumed to have a negative polarity. The polarity of a spin Hall angle can be set in accordance with a type of material constituting the spin-orbit torque wiring 20, a type of additive elements, an amount of additive elements, and the like.

A "spin Hall angle" is one index of the strength of a spin Hall effect and indicates the conversion efficiency of a spin current generated for a current flowing along the spin-orbit torque wiring 20. That is to say, the larger an absolute value of a spin Hall angle, the more the first spins S1 or the second spins S2 are injected into the first ferromagnetic layer 1.

When the spin-orbit torque wiring 20 mainly contains any metal element selected from the group consisting of those of Groups 8, 9, 10, 11, and 12, the spin-orbit torque wiring 20 has a spin Hall angle which has a positive polarity. When the spin-orbit torque wiring 20 mainly contains any metal element selected from the group consisting of those of Groups 3, 4, 5, and 6, a spin Hall angle of the spin-orbit torque wiring 20 has a negative polarity.

The spin-orbit torque wiring 20 is made of a metal, an alloy, an intermetallic compound, a metal boride, a metal carbide, a metal silicide, or a metal phosphide having a function of generating a spin current due to a spin Hall effect when a current flows through the wiring. The spin-orbit torque wiring 20 contains a material which generates an SOT sufficient to reverse the magnetization of the first ferromagnetic layer 1 in the first ferromagnetic layer 1.

It is desirable that main constituent elements of the spin-orbit torque wiring 20 be non-magnetic heavy metals. Heavy metals refer to metals having specific gravities greater than or equal to that of yttrium. It is desirable that non-magnetic heavy metals be non-magnetic metals having d electrons or f electrons in the outermost shell and having high atomic numbers of 39 or higher. These non-magnetic heavy metals have a large spin-orbit interaction which causes a spin Hall effect.

Electrons generally move in a direction opposite to that of a current regardless of their spin orientation. On the other hand, non-magnetic metals having high atomic numbers having d electrons or f electrons in the outermost shell have a large spin-orbit interaction and a spin Hall effect acts strongly. A flow of spins in the z direction depends on a degree of uneven distribution of the spins in the z direction. If a spin Hall effect strongly acts, spins easily become unevenly distributed and a spin current Js is easily generated.

The spin-orbit torque wiring 20 may contain a magnetic metal. A magnetic metal refers to a ferromagnetic metal or an antiferromagnetic metal. A small amount of magnetic metal contained in a non-magnetic material serves as a cause of scattering of spins. When spins scatter, a spin-orbit interaction is enhanced and the generation efficiency of a spin current with respect to a current increases. Main constituent elements of the spin-orbit torque wiring 20 may be only antiferromagnetic metals.

On the other hand, when an amount of magnetic metal to be added is excessively increased, a generated spin current scatters due to the added magnetic metal, and as a result, the spin current may decrease in some cases. It is desirable that a molar ratio of a magnetic metal to be added be sufficiently smaller than a total of molar ratios of elements constituting the spin-orbit torque wiring. The molar ratio of the magnetic metal to be added is preferably 3% or less of the total molar ratio.

The spin-orbit torque wiring 20 may contain a topological insulator. A topological insulator is a substance in which the inside of the substance is an insulator or a high-resistance material and a spin-polarized metal state occurs on a surface thereof. A topological insulator generates an internal magnetic field due to a spin-orbit interaction. Even when there is no external magnetic field, a new topological phase appears in a topological insulator due to the effect of the spin-orbit interaction. A topological insulator can generate a pure spin current with high efficiency due to a strong spin-orbit interaction and the breakage of reversal symmetry at an edge.

Examples of topological insulators include SnTe, $Bi_{1.5}Sb_{0.5}Te_{1.7}Se_{1.3}$, $TiBiSe_2$, $Bi_2Te_3$, $Bi_{1-x}Sb_x$, $(Bi_{1-x}Sb_x)_2Te_3$, and the like. These topological insulators can generate a spin current with high efficiency.

The spin-orbit torque wiring 20 illustrated in FIG. 1 has a width spreading from a first end 20b1 toward a second end 20b2. A width w1 of a first virtual cross-section 20A in the spin-orbit torque wiring 20 is different from a width w2 of a second virtual cross-section 20B therein. The width w1 is narrower than the width w2 (refer to FIG. 2). On the other hand, a thickness of the spin-orbit torque wiring 20 is constant (refer to FIG. 1). Therefore, an area of the first virtual cross-section 20A is different from an area of the second virtual cross-section 20B and the area of the first virtual cross-section 20A is smaller than the area of the second virtual cross-section 20B.

The first virtual cross-section 20A is a plane which passes through a first end 1b1 of the first ferromagnetic layer 1 in the x direction when viewed in plan view from the z direction and is orthogonal to the x direction. The second virtual cross-section 20B is a plane which passes through a second end 1b2 of the first ferromagnetic layer 1 in the x direction when viewed in plan view from the z direction and is orthogonal to the x direction. The first virtual cross-section 20A and the second virtual cross-section 20B are substantially parallel to a zy plane. The first virtual cross-section 20A and the second virtual cross-section 20B are included in the spin-orbit torque wiring 20.

A current density of a current I flowing through the first virtual cross-section 20A is higher than a current density of a current I flowing through the second virtual cross-section 20B. A current density is associated with an amount of spin to be injected into the first ferromagnetic layer 1. When a current density of a current I flowing through the spin-orbit torque wiring 20 is high, a large number of spins are injected into the first ferromagnetic layer 1. Spins which have been injected into the first ferromagnetic layer 1 provide a spin-orbit torque to the magnetization of the first ferromagnetic layer 1. The magnetization in the vicinity of the first end 1b1 of the first ferromagnetic layer 1 receives a spin-orbit torque larger than the magnetization in the vicinity of the second end 1b2. Therefore, in the first ferromagnetic layer 1, the magnetization reversal generates from the first end 1b1 side regardless of a flow direction of a current I.

Figure 3:
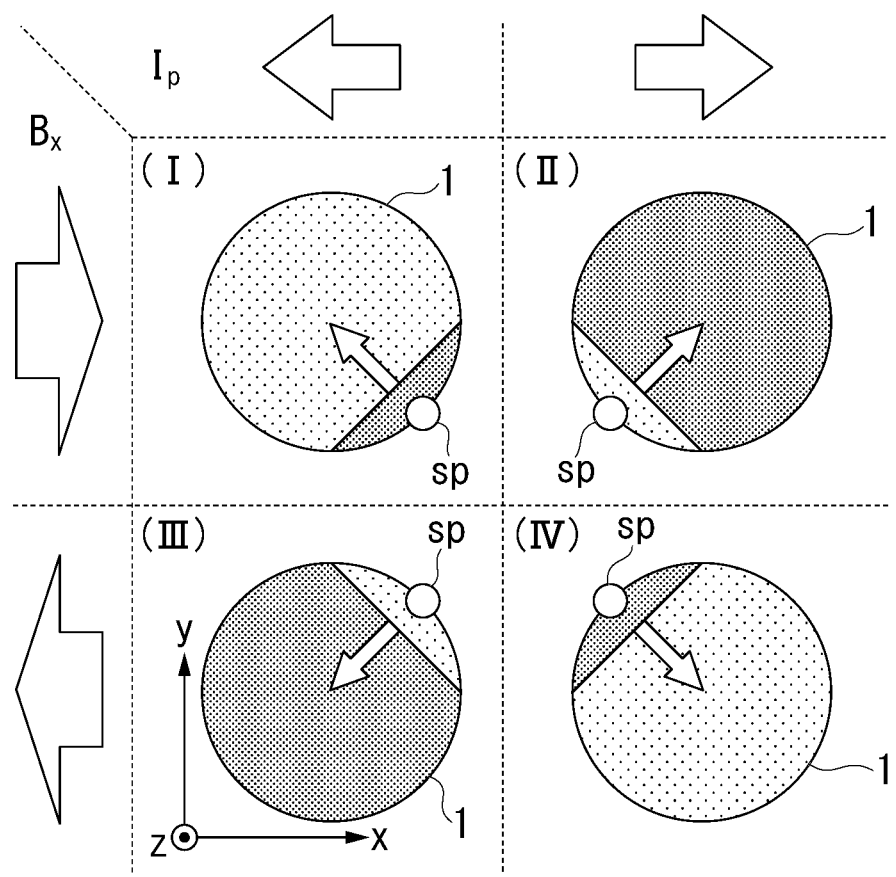
FIG. 3 is a diagram illustrating a start point of magnetization reversal in a first ferromagnetic layer when a current density of a current flowing through a spin-orbit torque wiring is constant.

FIG. 3 is a diagram illustrating a start point sp of magnetization reversal in the first ferromagnetic layer 1 when a current density of a current flowing through a spin-orbit torque wiring is constant. FIG. 3 corresponds to FIG. 3b in Non-Patent Document 1.

When a current density of a current flowing through a spin-orbit torque wiring is constant, the start point sp of magnetization reversal in the first ferromagnetic layer 1 changes in accordance with a direction of a current Ip flowing through a spin-orbit torque wiring and a direction of an external magnetic field Bx applied to the first ferromagnetic layer 1. The magnetization reversal of the first ferromagnetic layer 1 spreads from any of four start points sp (refer to FIG. 3). When the first ferromagnetic layer 1 is present in a completely symmetrical system, the propagations of the magnetization reversals are equivalent irrespective of which of the four start points sp the magnetization reversal starts from.

However, in reality, the first ferromagnetic layer 1 is not present in a completely symmetrical system. For example, when a shape of the first ferromagnetic layer 1 is not symmetrical, when the first ferromagnetic layer 1 contains impurities, when a shape of the first ferromagnetic layer 1 is disturbed due to manufacturing tolerances or the like, and the like, the first ferromagnetic layer 1 is not symmetrical. As a result, for example, in a case in which the same energy is applied to the first ferromagnetic layer 1, although magnetization reversal occurs when magnetization reversal starts from a certain start point sp, magnetization reversal may not occur appropriately when magnetization reversals start from different start points sp. When the first ferromagnetic layer 1 does not perform desired magnetization reversal, the reliability of the spin-orbit-torque magnetization rotational element 101 decreases.

The spin-orbit-torque magnetization rotational element 101 records and outputs information in accordance with a magnetization direction of the first ferromagnetic layer 1. A direction of a current I flowing through the spin-orbit torque wiring 20 when the magnetization of the first ferromagnetic layer 1 changes from a first state to a second state is opposite to a direction of the current I flowing through the spin-orbit torque wiring 20 when the magnetization of the first ferromagnetic layer 1 returns from the two state to the first state. Therefore, the direction of the current Ip flowing through the spin-orbit torque wiring and the direction of the external magnetic field Bx applied to the first ferromagnetic layer 1 cannot always be fixed.

On the other hand, in the spin-orbit-torque magnetization rotational element 101, areas of the first virtual cross-section 20A and the second virtual cross-section 20B are different and current densities are different in the first virtual cross-section 20A and the second virtual cross-section 20B. For this reason, the start point sp of the magnetization reversal in the first ferromagnetic layer 1 is fixed to the first virtual cross-section 20A side (the first end 1b1 side) having a high current density regardless of a direction in which a current I flows. Therefore, in the spin-orbit-torque magnetization rotational element 101, behaviors (a temporal behavior and a spatial behavior) of the magnetization reversal in the first ferromagnetic layer 1 are unified regardless of external factors.

As described above, according to the spin-orbit-torque magnetization rotational element 101 associated with the first embodiment, the behaviors of the magnetization reversal in the first ferromagnetic layer 1 are unified and the reliability of the spin-orbit-torque magnetization rotational element 101 increases.

The spin-orbit-torque magnetization rotational element 101 can be used as a spin-orbit-torque magnetoresistance effect element which will be described later. Furthermore, the spin-orbit-torque magnetization rotational element 101 can be used independently as an anisotropic magnetic sensor or an optical element using a magnetic Kerr effect or a magnetic Faraday effect. A spin current magnetization rotating element is particularly referred to as a spin current magnetization rotational element when the magnetization thereof is reversed.

(Modification 1)

Figure 4:
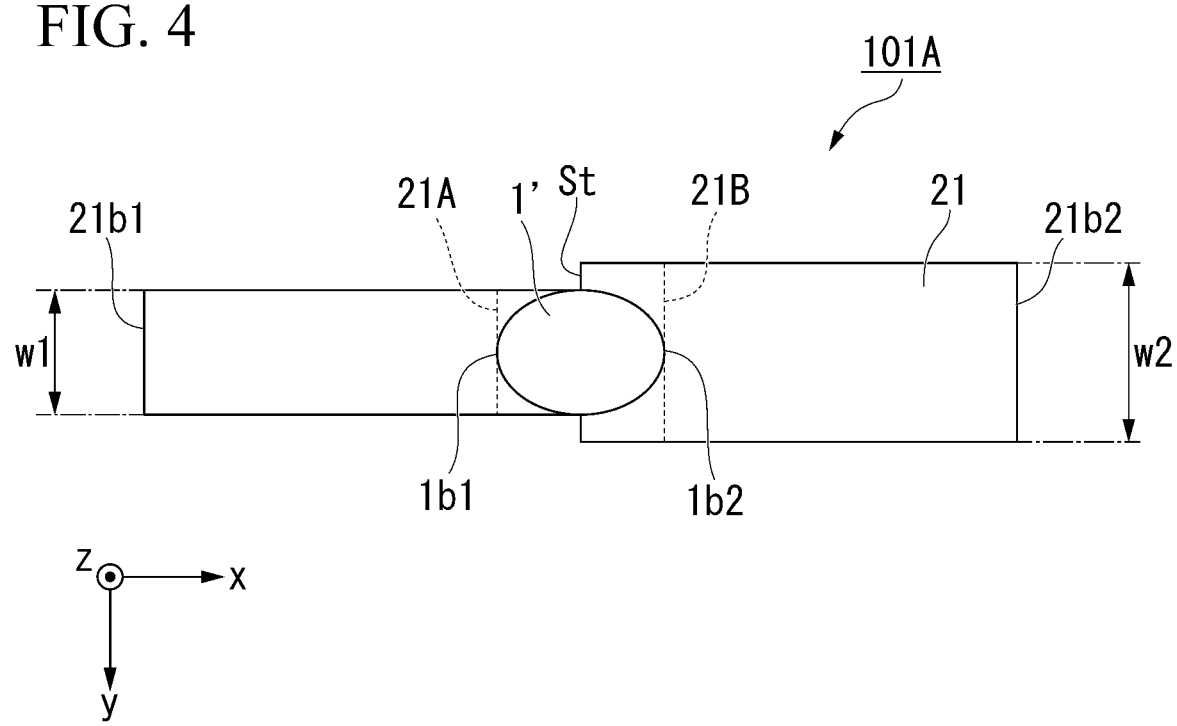
FIG. 4 is a plan view of a modification of the spin-orbit-torque magnetization rotational element according to the first embodiment.

FIG. 4 is a plan view of a modification of the spin-orbit-torque magnetization rotational element according to the first embodiment. A shape of a spin-orbit torque wiring 21 and a shape of a first ferromagnetic layer 1' in a spin-orbit-torque magnetization rotational element 101A according to Modification 1 are different from those of the spin-orbit-torque magnetization rotational element 101 illustrated in FIG. 2. Constituent elements in the spin-orbit-torque magnetization rotational element 101A that are the same as those of the spin-orbit-torque magnetization rotational element 101 will be denoted with the same reference numerals as those of the spin-orbit-torque magnetization rotational element 101.

A shape of the first ferromagnetic layer 1' when viewed in plan view from the z direction is an elliptical shape having a long axis in the x direction.

A width of the spin-orbit torque wiring 21 in the y direction changes in the middle thereof in the x direction. The spin-orbit torque wiring 21 has a step St which protrudes in the y direction. The step St is located between a first virtual cross-section 21A and a second virtual cross-section 21B in the x direction. In the spin-orbit torque wiring 21, a width w1 is constant from a first end 21b1 to the first virtual cross-section 21A of a spin-orbit torque wiring 21 and a width w2 is constant from a second end 21b2 to the second virtual cross-section 21B of the spin-orbit torque wiring 21.

In the spin-orbit-torque magnetization rotational element 101A according to Modification 1, an area of the first virtual cross-section 21A is different from an area of the second virtual cross-section 21B. Thus, behaviors (a temporal behavior and a spatial behavior) of the magnetization reversal of the first ferromagnetic layer 1' are unified regardless of external factors. Since magnetization reversal occurs from the vicinity of a portion in which a current density in the spin-orbit torque wiring 21 is high, even when a shape of the first ferromagnetic layer 1' when viewed in plan view is elliptical, the behaviors of the magnetization reversal are unified. Therefore, the same effect as in the spin-orbit-torque magnetization rotational element 101 can be obtained. Furthermore, since the spin-orbit torque wiring 21 does not have an inclined surface, it is easy to manufacture the spin-orbit torque wiring 21.

Second Embodiment

Figure 5:
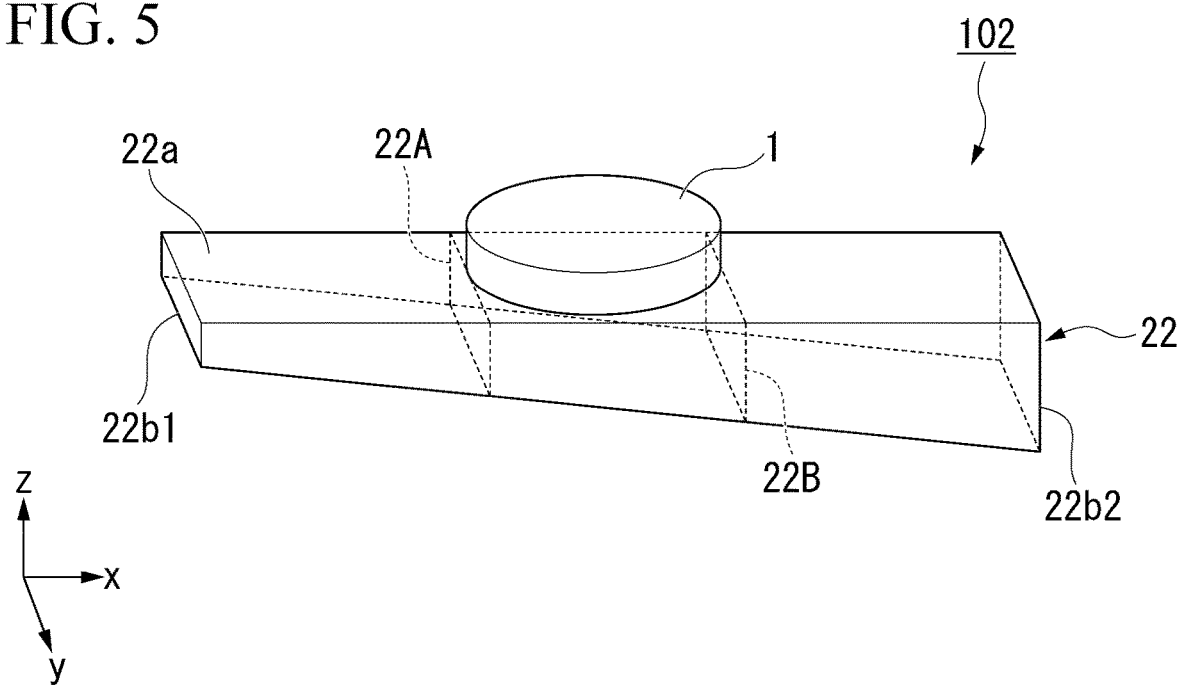
FIG. 5 is a perspective view of a spin-orbit-torque magnetization rotational element according to a second embodiment.
Figure 6:
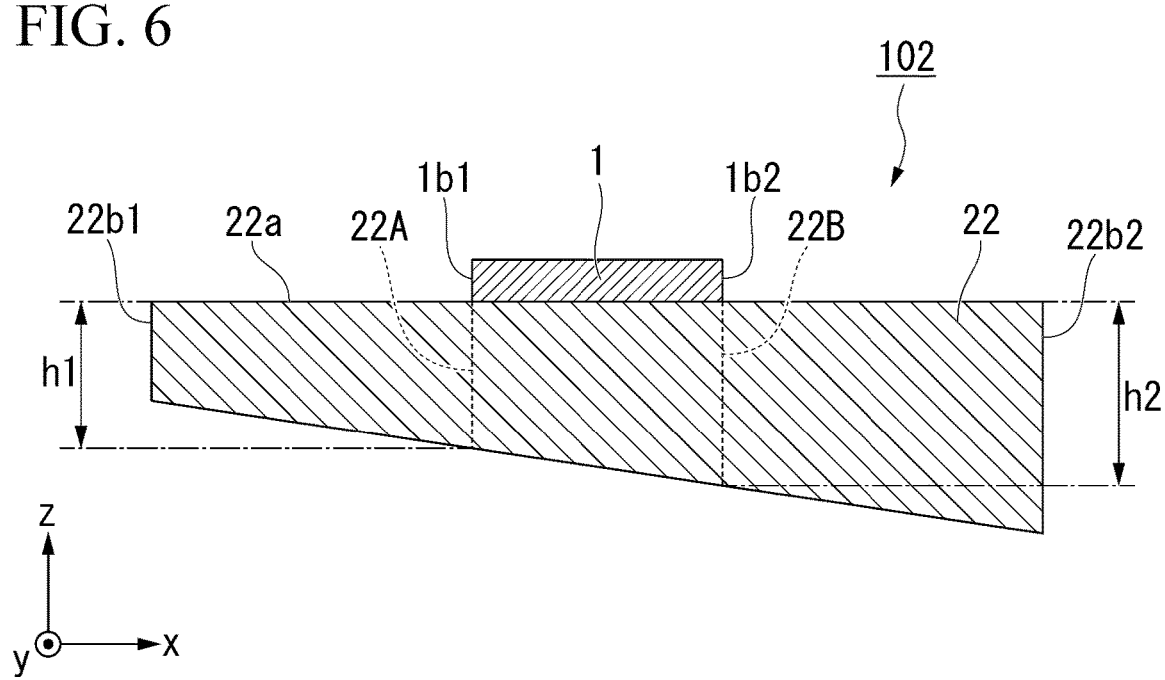
FIG. 6 is a cross-sectional view of the spin-orbit-torque magnetization rotational element according to the second embodiment.

FIG. 5 is a perspective view of a spin-orbit-torque magnetization rotational element according to a second embodiment. FIG. 6 is a cross-sectional view of the spin-orbit-torque magnetization rotational element according to the second embodiment. A spin-orbit-torque magnetization rotational element 102 includes a first ferromagnetic layer 1 and a spin-orbit torque wiring 22. A shape of the spin-orbit torque wiring 22 is different from that of the spin-orbit-torque magnetization rotational element 101 illustrated in FIG. 1. Constituent elements in the spin-orbit-torque magnetization rotational element 102 that are the same as those of the spin-orbit-torque magnetization rotational element 101 will be denoted with the same reference numerals as those of the spin-orbit-torque magnetization rotational element 101.

A thickness of the spin-orbit torque wiring 22 in the z direction from a first end 22b1 toward a second end 22b2 increases. A thickness h1 of a first virtual cross-section 22A in the spin-orbit torque wiring 22 is different from a thickness h2 of a second virtual cross-section 22B (refer to FIG. 6). On the other hand, a width of the spin-orbit torque wiring 22 in the y direction is constant. Therefore, an area of the first virtual cross-section 22A is different from an area of the second virtual cross-section 22B and the area of the first virtual cross-section 22A is smaller than the area of the second virtual cross-section 22B. The first virtual cross-section 22A and the second virtual cross-section 22B correspond to the first virtual cross-section 20A and the second virtual cross-section 20B illustrated in FIG. 1, respectively.

Also, a first surface 22a of the spin-orbit torque wiring 22 spreads along the xy plane. The first surface 22a is substantially parallel to the xy plane. The first ferromagnetic layer 1 faces the first surface 22a. Therefore, an orientation direction of the magnetization of the first ferromagnetic layer 1 is substantially constant in the xy plane. For example, the magnetization of the first ferromagnetic layer 1 is oriented in the z direction substantially perpendicular to the first surface 22a or in any direction in the xy plane substantially parallel to the first surface 22a.

A current density of a current I flowing through the first virtual cross-section 22A is higher than a current density of a current I flowing through the second virtual cross-section 22B. Furthermore, in a state in which no external force is applied, an orientation direction of the magnetization in the first ferromagnetic layer 1 is substantially the same at any position in the xy plane. Therefore, in the first ferromagnetic layer 1, magnetization reversal occurs from a first end 1b1 side regardless of a flow direction of the current I.

When a start point of the magnetization reversal is fixed in the first ferromagnetic layer 1, behaviors (a temporal behavior and a spatial behavior) of the magnetization reversal of the first ferromagnetic layer 1 are unified when the magnetization of the first ferromagnetic layer 1 changes from a first state to a second state and when the magnetization of the first ferromagnetic layer 1 returns from the two state to the first state. Therefore, the reliability of information to be recorded and output by the spin-orbit-torque magnetization rotational element 102 increases.

(Modification 2)

Figure 7:
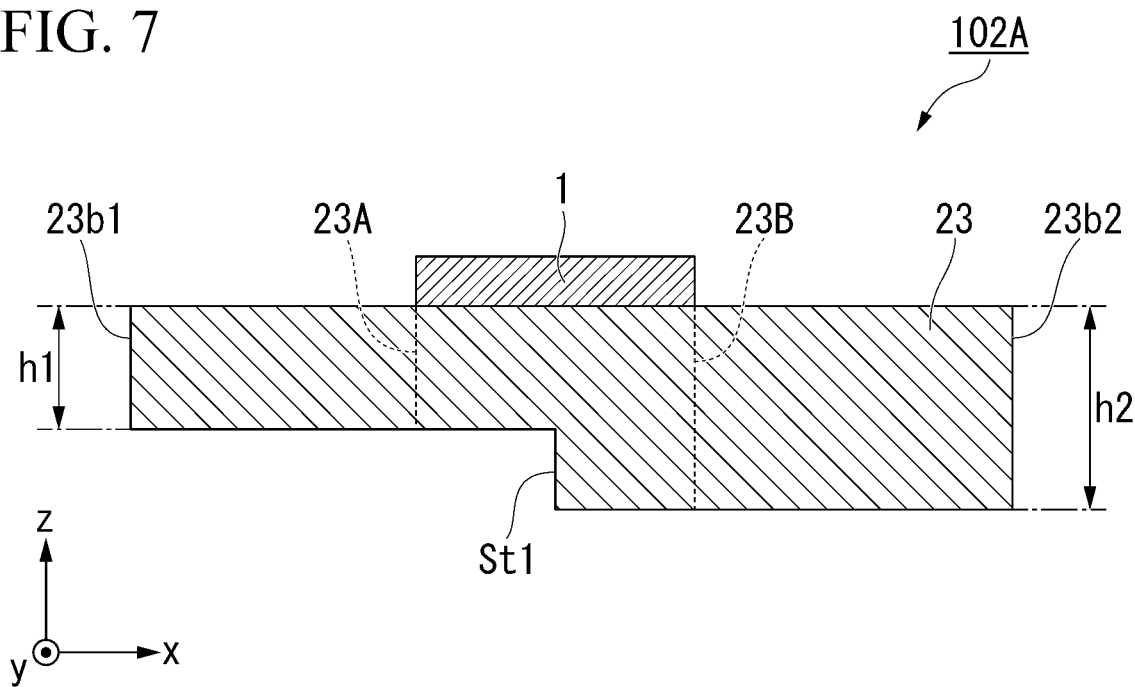
FIG. 7 is a cross-sectional view of a modification of the spin-orbit-torque magnetization rotational element according to the second embodiment.

FIG. 7 is a plan view of a modification of the spin-orbit-torque magnetization rotational element according to the second embodiment. A shape of a spin-orbit torque wiring 23 in a spin-orbit-torque magnetization rotational element 102A illustrated in FIG. 7 is different from that of the spin-orbit-torque magnetization rotational element 102 illustrated in FIG. 6. Constituent elements of the spin-orbit-torque magnetization rotational element 102A that are the same as those of the spin-orbit-torque magnetization rotational element 102 will be denoted with the same reference numerals as those of the spin-orbit-torque magnetization rotational element 102.

A thickness of the spin-orbit torque wiring 23 in the z direction changes in the middle of the x direction. The spin-orbit torque wiring 23 has a step St1 which protrudes in the −z direction. In the spin-orbit torque wiring 23, a thickness h1 of the spin-orbit torque wiring 23 from a first end 23b1 toward the first virtual cross-section 23A is constant and a thickness h2 of the spin-orbit torque wiring 23 from a second end 23b2 toward the second virtual cross-section 23B is constant. The step St1 is located between the first virtual cross-section 23A and the second virtual cross-section 23B in the x direction.

In a spin-orbit-torque magnetization rotational element 102A according to Modification 2, an area of the first virtual cross-section 23A is different from an area of the second virtual cross-section 23B. Thus, behaviors (a temporal behavior and a spatial behavior) of the magnetization reversal of the first ferromagnetic layer 1 are unified regardless of external factors. Therefore, the same effect as that of the spin-orbit-torque magnetization rotational element 102 can be obtained. Furthermore, since the spin-orbit torque wiring 23 does not have an inclined surface, it is easy to manufacture the spin-orbit torque wiring 23.

Third Embodiment

Figure 8:
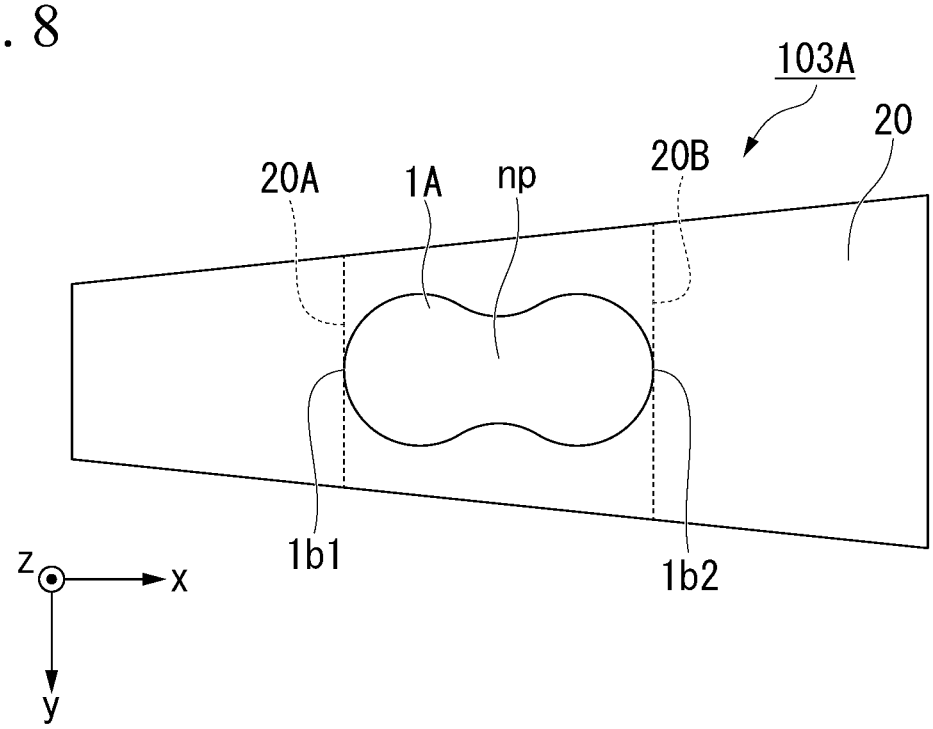
FIG. 8 is a plan view of a spin-orbit-torque magnetization rotational element according to a third embodiment.

FIG. 8 is a plan view of a spin-orbit-torque magnetization rotational element according to a third embodiment. A spin-orbit-torque magnetization rotational element 103A includes a first ferromagnetic layer 1A and a spin-orbit torque wiring 20. A shape of the first ferromagnetic layer 1A is different from that of the spin-orbit-torque magnetization rotational element 101 illustrated in FIG. 2. Constituent elements of the spin-orbit-torque magnetization rotational element 103A that are the same as those of the spin-orbit-torque magnetization rotational element 101 will be denoted with the same reference numerals as those of the spin-orbit-torque magnetization rotational element 101.

The first ferromagnetic layer 1A has a narrow width portion np whose width in the y direction is locally narrower between a first end 1b1 and a second end 1b2 when viewed in plan view from the z direction. The narrow width portion np is a portion in the vicinity of a minimum value in the case of a graph obtained by setting a horizontal axis to a position of the first ferromagnetic layer 1A in the x direction and a vertical axis to a width in the y direction at that position. The narrow width portion np is, for example, a portion between two inflection points having the minimum value therebetween in the graph.

In the spin-orbit-torque magnetization rotational element 103A, an area of the first virtual cross-section 20A is different from an area of the second virtual cross-section 20B and current densities are different in the first virtual cross-section 20A and the second virtual cross-section 20B. For this reason, a start point of the magnetization reversal in the first ferromagnetic layer 1 is fixed to the first virtual cross-section 20A side (a first end 1b1 side). The magnetization reversal propagates from the first end 1b1 toward a second end 1b2.

When a shape of the first ferromagnetic layer 1A when viewed in plan view is sufficiently large to be able to form a magnetic domain wall inside the first ferromagnetic layer 1A, the propagation of the magnetization reversal from the first end 1b1 toward the second end 1b2 is confirmed as the movement of a magnetic domain wall. The magnetic domain wall is a portion which is at a boundary between a first magnetic domain and a second magnetic domain and alleviates a difference in magnetization state between the first magnetic domain and the second magnetic domain. Even when the shape of the first ferromagnetic layer 1A when viewed in plan view is small, the propagation of the magnetization reversal from the first end 1b1 toward the second end 1b2 can be regarded as the movement of microscopic magnetic domain walls (boundaries of different magnetization states) when temporal and spatial behaviors of the magnetization are subdivided.

A magnetic domain wall and a microscopic magnetic domain wall are stabilized at a position in the first ferromagnetic layer 1A at which a potential distribution sensed by the magnetic domain wall or the microscopic magnetic domain wall is low. When a width of the first ferromagnetic layer 1A in the y direction is partially different, a potential distribution in the first ferromagnetic layer 1A sensed by the magnetic domain wall or the microscopic magnetic domain wall changes for each position. Therefore, the ease of propagation of the magnetization reversal differs for each position between the first end b1 and the second end 1b2 and the magnetization reversal becomes difficult to propagate in the narrow width portion np. In other words, the magnetic domain wall or the microscopic magnetic domain wall remains at the narrow width portion np in accordance with an amount of spin to be injected into the first ferromagnetic layer 1A.

The spin-orbit-torque magnetization rotational element 103A can record information in multiple values using the narrow width portion np. When a small amount of current flows through the spin-orbit torque wiring 20, magnetization reversal does not occur even at a start point and information of "0" is recorded. When a large amount of current flows through the spin-orbit torque wiring 20, magnetization reversal propagates to the second end 1b2 side and information of "1" is recorded. In a case in which an amount of current flowing through the spin-orbit torque wiring 20 is between the above two cases, magnetization reversal starting from a start point remains at the narrow width portion np and information of "0.5" is recorded. In the spin-orbit-torque magnetization rotational element 103A, the start point of the magnetization reversal is fixed. Thus, the behaviors of the magnetization reversals are unified and information of multiple values can be recorded stably.

(Modification 3)

Figure 9:
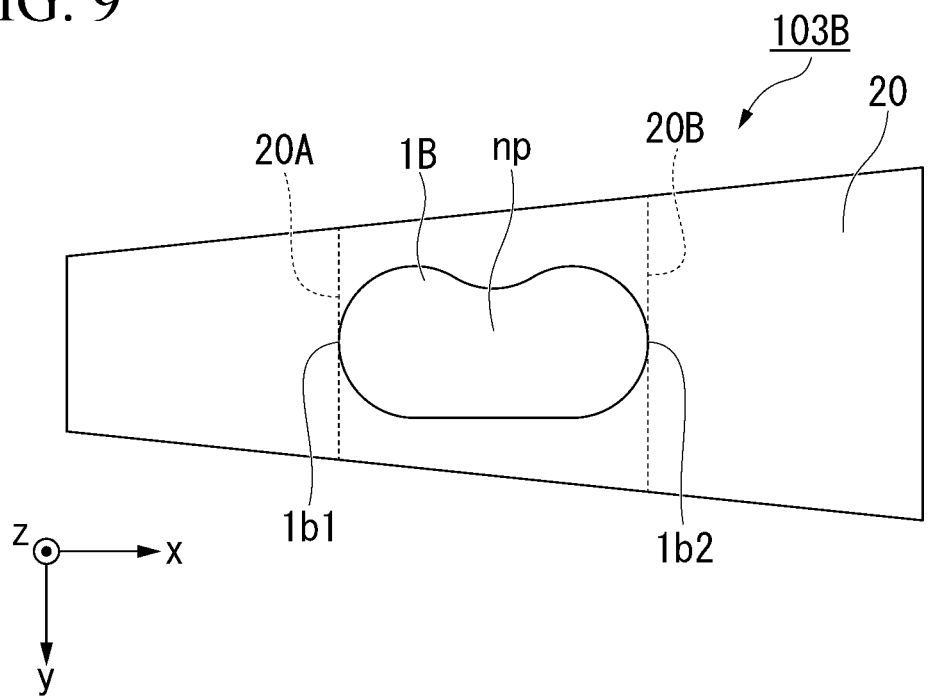
FIG. 9 is a plan view of a modification of the spin-orbit-torque magnetization rotational element according to the third embodiment.

FIG. 9 is a plan view of a modification of the spin-orbit-torque magnetization rotational element according to the third embodiment. A shape of a first ferromagnetic layer 1B in a spin-orbit-torque magnetization rotational element 103B illustrated in FIG. 9 is different from that of the spin-orbit-torque magnetization rotational element 103A illustrated in FIG. 8. Constituent elements in the spin-orbit-torque magnetization rotational element 103B that are the same as those of the spin-orbit-torque magnetization rotational element 103A will be denoted with the same reference numerals as those of the spin-orbit-torque magnetization rotational element 103A.

The first ferromagnetic layer 1B and the first ferromagnetic layer 1A illustrated in FIG. 8 differ in that, in the first ferromagnetic layer 1B, a concave portion is formed only in a side surface thereof in the −y direction and a narrow width portion np is formed. If a width of the first ferromagnetic layer 1B in the y direction partially changes, the potential distribution in the first ferromagnetic layer 1B sensed by the magnetic domain wall or the microscopic magnetic domain wall changes for each position. Therefore, the spin-orbit-torque magnetization rotational element 103B can also record information in multiple values using the narrow width portion np.

(Modification 4)

Figure 10:
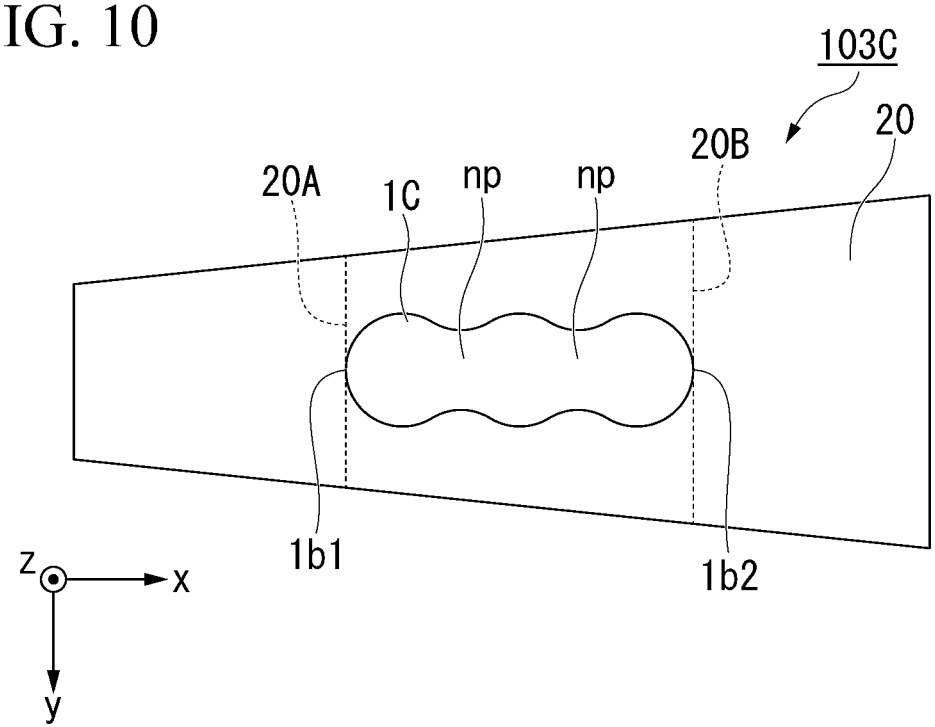
FIG. 10 is a plan view of a modification of the spin-orbit-torque magnetization rotational element according to the third embodiment.

FIG. 10 is a plan view of a modification of the spin-orbit-torque magnetization rotational element according to the third embodiment. A shape of a first ferromagnetic layer 1C in a spin-orbit-torque magnetization rotational element 103C illustrated in FIG. 10 is different from that of the spin-orbit-torque magnetization rotational element 103A illustrated in FIG. 8. Constituent elements in the spin-orbit-torque magnetization rotational element 103C that are the same as those of the spin-orbit-torque magnetization rotational element 103A will be denoted with the same reference numerals as those of the spin-orbit-torque magnetization rotational element 103A.

The first ferromagnetic layer 1C has a plurality of narrow width portions np in the x direction. The magnetic domain wall or the microscopic magnetic domain wall remains at the narrow width portions np in accordance with an amount of spin to be injected into the first ferromagnetic layer 1C. Therefore, the spin-orbit-torque magnetization rotational element 103C can record information in multiple values using each of the narrow width portions np.

Fourth Embodiment

Figure 11:
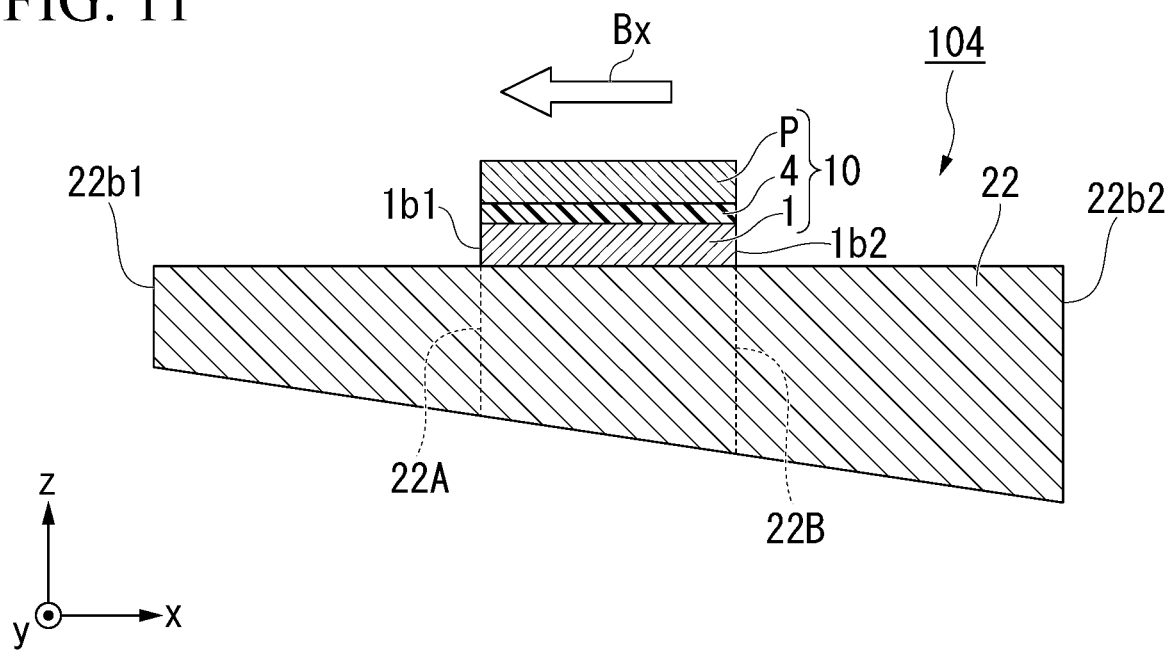
FIG. 11 is a cross-sectional view of a spin-orbit-torque magnetoresistance effect element according to a fourth embodiment.

FIG. 11 is a cross-sectional view of a spin-orbit-torque magnetoresistance effect element 104 according to a fourth embodiment. The spin-orbit-torque magnetoresistance effect element 104 includes a laminate 10 and a spin-orbit torque wiring 22. The spin-orbit-torque magnetoresistance effect element 104 has a first non-magnetic layer 4 and a magnetization fixed layer P provided above an upper surface of the first ferromagnetic layer 1 of the spin-orbit-torque magnetization rotational element 102 illustrated in FIG. 6. Another spin-orbit-torque magnetization rotational element may be used instead of the spin-orbit-torque magnetization rotational element 102 illustrated in FIG. 6. Constituent elements in the spin-orbit-torque magnetoresistance effect element 104 that are the same as those of the spin-orbit-torque magnetization rotational element 102 will be denoted with the same reference numerals as those of the spin-orbit-torque magnetization rotational element 102 and description thereof will be omitted.

<Laminate>

The laminate 10 includes the first ferromagnetic layer 1, the first non-magnetic layer 4, and the magnetization fixed layer P. The laminate 10 has the same constitution as a general magnetoresistance effect element. The laminate 10 has the same constitution as a tunneling magnetoresistance effect (TMR; Tunneling Magnetoresistance) element when the first non-magnetic layer 4 is made of an insulator and has the same constitution as a giant magnetoresistance effect (GMR; Giant Magnetoresistance) element when the first non-magnetic layer 4 is made of a metal.

The laminate 10 functions using the magnetization of the magnetization fixed layer P being fixed in one direction and a relative change in magnetization direction of the first ferromagnetic layer 1. When the laminate 10 is a coercive force difference type (a pseudo spin valve type) magnetoresistance effect element, the coercivity of the magnetization fixed layer P is set to be larger than the coercivity of the first ferromagnetic layer 1. When the laminate 10 is an exchange bias type (a spin valve; a spin valve type) magnetoresistance effect element, the magnetization fixed layer P is subjected to interlayer antiferromagnetic (SAF) coupling and the magnetization of the magnetization fixed layer P is fixed to the first ferromagnetic layer 1.

The laminate 10 may include layers other than the first ferromagnetic layer 1, the magnetization fixed layer P, and the first non-magnetic layer 4. The laminate 10 may include, for example, an underlayer, a cap layer, and the like which enhance the crystallinity of the laminate 10. The underlayer is formed between the spin-orbit torque wiring 20 and the laminate 10. The cap layer is formed above the upper surface of the laminate 10.

The magnetization fixed layer P can be made of the same material as the first ferromagnetic layer 1.

The first non-magnetic layer 4 is made of a non-magnetic insulator, semiconductor, or metal. Examples of the non-magnetic insulator include $Al_2O_3$, $SiO_2$, $MgO$, $MgAl_2O_4$, and materials in which a part of Al, Si, or Mg thereof is substituted with Zn, Be, or the like. When the first non-magnetic layer 4 is made of the non-magnetic insulator, the first non-magnetic layer 4 serves as a tunnel barrier layer. MgO and MgAl$_2$O$_4$ can easily realize coherent tunneling between the first ferromagnetic layer 1 and the magnetization fixed layer P. Examples of the non-magnetic metals include Cu, Au, Ag, and the like. Furthermore, examples of the non-magnetic semiconductors include Si, Ge, CuInSe$_2$, CuGaSe$_2$, Cu(In, Ga)Se$_2$, and the like.

In the spin-orbit-torque magnetoresistance effect element 104, areas of a first virtual cross-section 22A and a second virtual cross-section 22B in a spin-orbit torque wiring 22 differ. Therefore, the spin-orbit-torque magnetoresistance effect element 104 can fix a start point of the magnetization reversal of the first ferromagnetic layer 1 regardless of external factors and behaviors (a temporal behavior and a spatial behavior) of the magnetization reversal of the first ferromagnetic layer 1 are unified.

Also, the spin-orbit-torque magnetoresistance effect element 104 may further include a magnetic field application mechanism for applying an external magnetic field to the first ferromagnetic layer 1. FIG. 11 illustrates an external magnetic field Bx to be applied to the first ferromagnetic layer 1 as well.

As illustrated in FIG. 3, in a case in which a current density of a current flowing through the spin-orbit torque wiring 22 is constant, when a current flows from a second end 22b2 toward a first end 22b1 of the spin-orbit torque wiring 22 (when Ip in FIG. 3 corresponds to an arrow directed leftward: hereinafter when a current directed leftward flows), a start point sp of the magnetization reversal in the first ferromagnetic layer 1 is located on the second end 1b2 side in the first ferromagnetic layer 1. The spin-orbit-torque magnetoresistance effect element 104 forcibly fixes the start point sp of the magnetization reversal to the first end 1b1 side using a change in current density of the first virtual cross-section 22A and the second virtual cross-section 22B in the spin-orbit torque wiring 22.

The ease of the magnetization reversal of the first ferromagnetic layer 1 depends on whether a current directed leftward or a current directed rightward flows through the spin-orbit torque wiring 22 (when a current flows through the spin-orbit torque wiring 22 from the first end 22b1 toward the second end 22b2 thereof or when Ip in FIG. 3 corresponds to an arrow directed rightward). When a current directed leftward flows through the spin-orbit torque wiring 22, a start point sp of the magnetization reversal is forcibly changed. Thus, the magnetization reversal is difficult. That is to say, there is a concern that the magnetization of the first ferromagnetic layer 1 varying in accordance with a first state is likely to be changed to a second state and a second state is likely to be changed to a first state.

When the external magnetic field Bx is applied to the first ferromagnetic layer 1 using the magnetic field application mechanism, the variation of this reversal probability is corrected. In the case of the magnetic field application mechanism, for example, it is desirable to apply a magnetic field from a first end 1b1 toward a second end 1b2 to the first ferromagnetic layer 1 when an area of a first virtual cross-section 22A is larger than an area of a second virtual cross-section 22B and it is desirable to apply a magnetic field from the second end 1b2 toward the first end 1b1 to the first ferromagnetic layer 1 when the area of the first virtual cross-section 22A is smaller than the area of the second virtual cross-section 22B.

(Modification 5)

Figure 12:
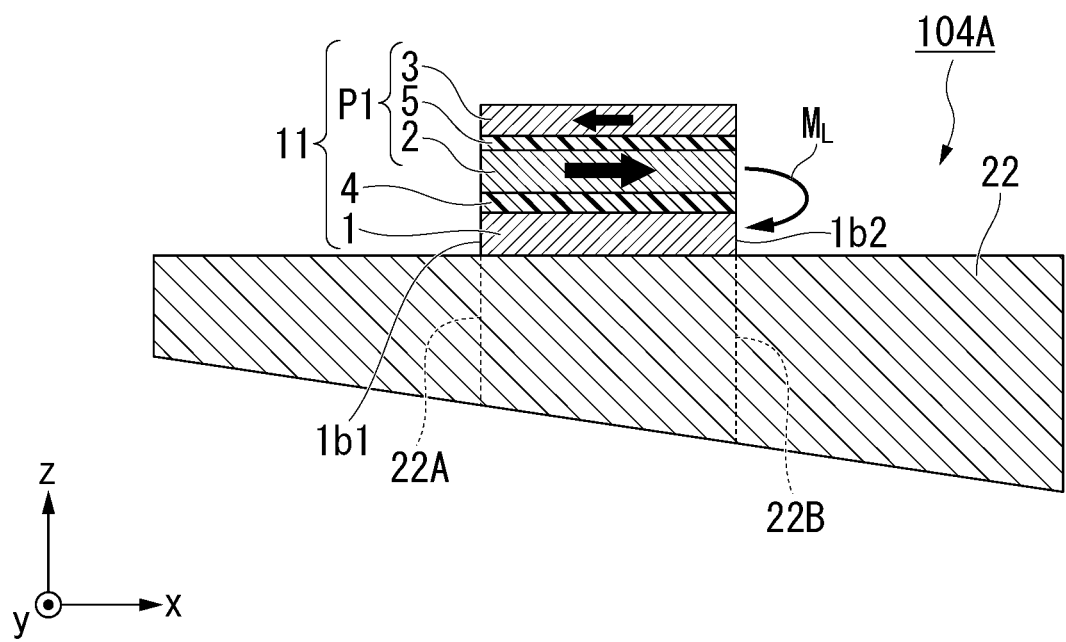
FIG. 12 is a cross-sectional view of a modification of the spin-orbit-torque magnetoresistance effect element according to the fourth embodiment.

FIG. 12 is a cross-sectional view of a modification of the spin-orbit-torque magnetoresistance effect element according to the fourth embodiment. A constitution of a laminate 11 in a spin-orbit-torque magnetoresistance effect element 104A illustrated in FIG. 12 is different from that of the spin-orbit-torque magnetoresistance effect element 104 illustrated in FIG. 11. Constituent elements in the spin-orbit-torque magnetoresistance effect element 104A that are the same as those of the spin-orbit-torque magnetoresistance effect element 104 will be denoted with the same reference numerals as those of the spin-orbit-torque magnetoresistance effect element 104.

The laminate 11 includes a first ferromagnetic layer 1, a first non-magnetic layer 4, a second ferromagnetic layer 2, a second non-magnetic layer 5, and a third ferromagnetic layer 3 in this order from a side closer to a spin-orbit torque wiring 22. The second ferromagnetic layer 2, the second non-magnetic layer 5, and the third ferromagnetic layer 3 serve as a magnetization fixed layer P1. The second non-magnetic layer 5 is made of the same material as the first non-magnetic layer 4 and the third ferromagnetic layer 3 is made of the same material as the first ferromagnetic layer 1 and the second ferromagnetic layer 2.

Orientation directions of the magnetizations in the second ferromagnetic layer 2 and the third ferromagnetic layer 3 are opposite to each other. A magnetization direction of the second ferromagnetic layer 2 is fixed using the second ferromagnetic layer 2 and the third ferromagnetic layer 3 subjected to antiferromagnetic coupling.

A product of a saturation magnetization and a volume of the second ferromagnetic layer 2 is larger than a product of a saturation magnetization and a volume of the third ferromagnetic layer 3. When the product of the saturation magnetization and the volume of the second ferromagnetic layer 2 is the same as the product of the saturation magnetization and the volume of the third ferromagnetic layer 3, interlayer antiferromagnetic (SAF) coupling is formed in the magnetization fixed layer P1 and a leakage magnetic field $M_L$ does not occur. On the other hand, if the product of the saturation magnetization and the volume of the second ferromagnetic layer 2 is larger than the product of the saturation magnetization and the volume of the third ferromagnetic layer 3, a leakage magnetic field $M_L$ from the second end 1b2 toward the first end 1b1 is applied to the first ferromagnetic layer 1.

In the spin-orbit-torque magnetoresistance effect element 104A according to Modification 5, the leakage magnetic field $M_L$ is an external magnetic field Bx applied to the first ferromagnetic layer 1. The external magnetic field Bx can correct a variation in reversal probability of the magnetization in the first ferromagnetic layer 1. In this case, it is desirable that the spin-orbit torque wiring 22 have a spin Hall angle which has a positive polarity and mainly include any metal element selected from the group consisting of Groups 8, 9, 10, 11, and 12.

(Modification 6)

Figure 13:
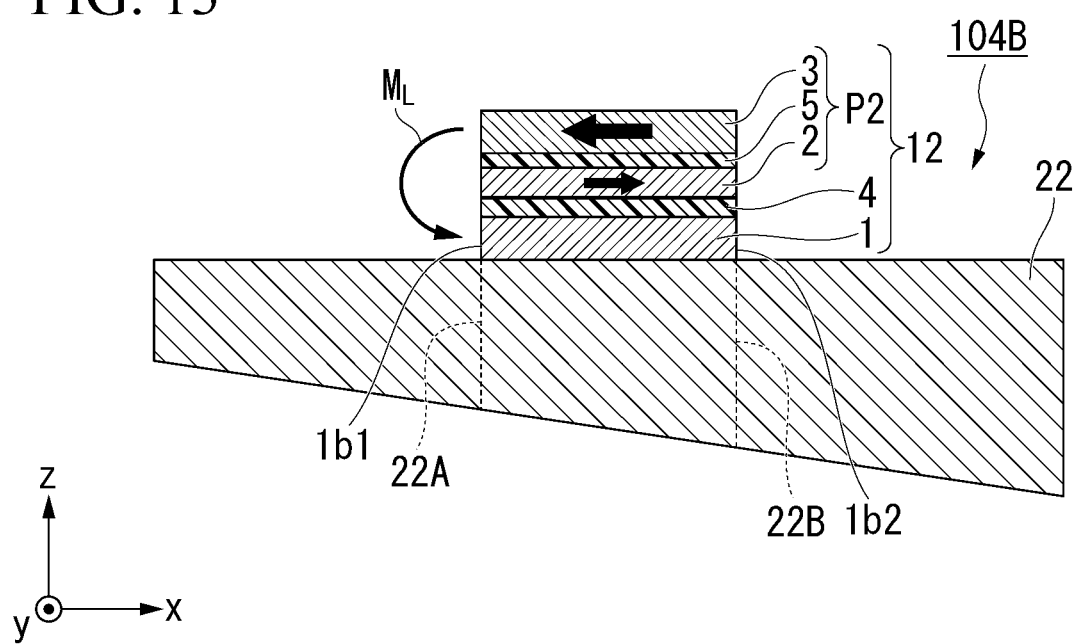
FIG. 13 is a cross-sectional view of a modification of the spin-orbit-torque magnetoresistance effect element according to the fourth embodiment.

FIG. 13 is a cross-sectional view of a modification of the spin-orbit-torque magnetoresistance effect element according to the fourth embodiment. A constitution of a laminate 12 in a spin-orbit-torque magnetoresistance effect element 104B illustrated in FIG. 13 is different from that of the spin-orbit-torque magnetoresistance effect element 104 illustrated in FIG. 11. Constituent elements in the spin-orbit-torque magnetoresistance effect element 104B that are the same as those of the spin-orbit-torque magnetoresistance effect element 104 will be denoted with the same reference numerals as those of the spin-orbit-torque magnetoresistance effect element 104.

The laminate 12 includes a first ferromagnetic layer 1, a first non-magnetic layer 4, a second ferromagnetic layer 2, a second non-magnetic layer 5, and a third ferromagnetic layer 3 in this order from a side closer to a spin-orbit torque wiring 22. The second ferromagnetic layer 2, the second non-magnetic layer 5, and the third ferromagnetic layer 3 serve as a magnetization fixed layer P2.

Orientation directions of the magnetizations of the second ferromagnetic layer 2 and the third ferromagnetic layer 3 are opposite to each other. A product of a saturation magnetization and a volume of the second ferromagnetic layer 2 is smaller than a product of a saturation magnetization and a volume of the third ferromagnetic layer 3. The magnetization fixed layer P2 applies a leakage magnetic field $M_L$ from a first end 1b1 toward a second end 1b2 to the first ferromagnetic layer 1.

In the spin-orbit-torque magnetoresistance effect element 104B according to Modification 6, the leakage magnetic field $M_L$ is an external magnetic field Bx applied to the first ferromagnetic layer 1. The external magnetic field Bx can correct a variation in reversal probability of the first ferromagnetic layer 1. In this case, it is desirable that the spin-orbit torque wiring 22 have a spin Hall angle which has a negative polarity and mainly include any metal element selected from the group consisting of Groups 3, 4, 5, and 6. If the polarity of the spin Hall angle in the spin-orbit torque wiring 22 is reversed, a position of the start point sp illustrated in FIG. 3 is also reversed. Therefore, in this case, it is desirable to apply a magnetic field from a second end 1b2 toward the first end 1b1 to the first ferromagnetic layer 1 when an area of a first virtual cross-section 22A is larger than an area of a second virtual cross-section 22B and it is desirable to apply a magnetic field from the first end 1b1 toward the second end 1b2 to the first ferromagnetic layer 1 when the area of the first virtual cross-section 22A is smaller than the area of the second virtual cross-section 22B.

Fifth Embodiment

Figure 14:
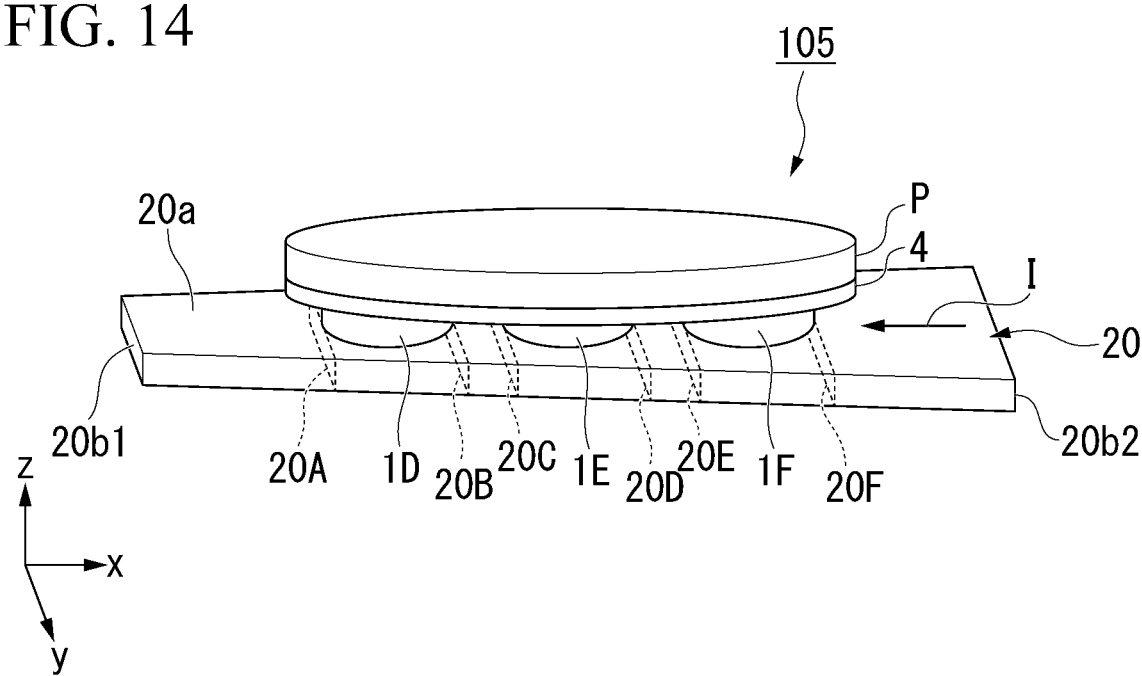
FIG. 14 is a perspective view of a spin-orbit-torque magnetoresistance effect element according to a fifth embodiment.
Figure 15:
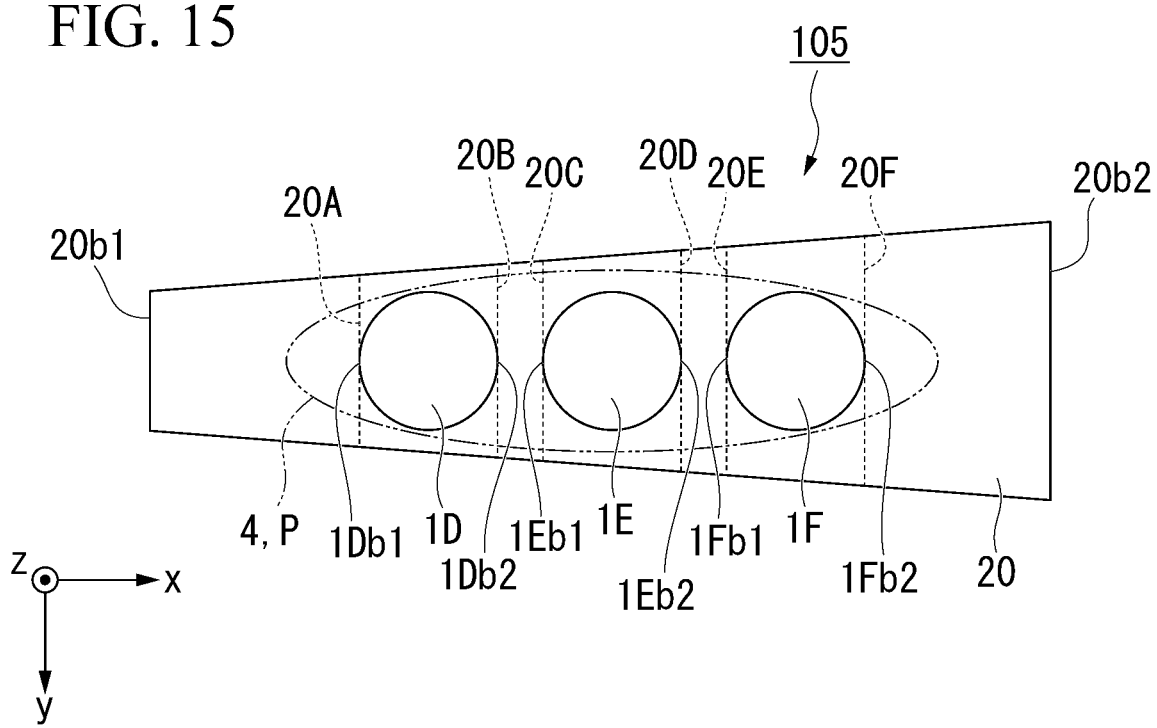
FIG. 15 is a plan view of the spin-orbit-torque magnetoresistance effect element according to the fifth embodiment.

FIG. 14 is a perspective view of a spin-orbit-torque magnetoresistance effect element 105 according to a fifth embodiment. Furthermore, FIG. 15 is a schematic plan view of the spin-orbit-torque magnetoresistance effect element 105 according to the fifth embodiment. The spin-orbit-torque magnetoresistance effect element 105 and the spin-orbit-torque magnetoresistance effect element 104 illustrated in FIG. 11 differ in that, in the spin-orbit-torque magnetoresistance effect element 105, a first ferromagnetic layer is divided into a plurality of portions. Constituent elements of the spin-orbit-torque magnetoresistance effect element 105 that is the same as those of the spin-orbit-torque magnetoresistance effect element 104 illustrated in FIG. 11 will be denoted with the same reference numerals as those of the spin-orbit-torque magnetoresistance effect element 104 and description thereof will be omitted.

The spin-orbit-torque magnetoresistance effect element 105 includes a spin-orbit torque wiring 20, a plurality of first ferromagnetic layers 1D, 1E, and 1F, a first non-magnetic layer 4, and a magnetization fixed layer P. The plurality of first ferromagnetic layers 1D, 1E, and 1F face a first surface 20a of the spin-orbit torque wiring 20. The plurality of first ferromagnetic layers 1D, 1E, and 1F are located at predetermined intervals in the x direction. The plurality of first ferromagnetic layers 1D, 1E, and 1F have the same first non-magnetic layer 4 and magnetization fixed layer P.

The spin-orbit torque wiring 20 has a first virtual cross-section 20A, a second virtual cross-section 20B, a third virtual cross-section 20C, a fourth virtual cross-section 20D, a fifth virtual cross-section 20E, and a sixth virtual cross-section 20F. The first virtual cross-section 20A, the third virtual cross-section 20C, and the fifth virtual cross-section 20E are surfaces which pass through first ends 1Db1, 1Eb1, and 1Fb1 of the first ferromagnetic layers 1D, 1E, and 1F in the x direction and are orthogonal to the x direction when viewed in plan view from the z direction. The second virtual cross-section 20B, the fourth virtual cross-section 20D, and the sixth virtual cross-section 20F are surfaces which pass through second ends 1Db2, 1Eb2, and 1Fb2 of the first ferromagnetic layers 1D, 1E, and 1F in the x direction and are orthogonal to the x direction when viewed in plan view from the z direction.

Areas of virtual cross-sections are smaller in the order of the first virtual cross-section 20A, the second virtual cross-section 20B, the third virtual cross-section 20C, the fourth virtual cross-section 20D, the fifth virtual cross-section 20E, and the sixth virtual cross-section 20F. Current densities of a current I flowing through the spin-orbit torque wiring 20 are larger in the order of the first virtual cross-section 20A, the second virtual cross-section 20B, the third virtual cross-section 20C, the fourth virtual cross-section 20D, the fifth virtual cross-section 20E, and the sixth virtual cross-section 20F. The magnetization reversal in each of the first ferromagnetic layers 1D, 1E, and 1F occurs from the first ends 1Db1, 1Eb1, and 1Fb1 toward the second ends 1Db2, 1Eb2, and 1Fb2.

Also, the magnetization reversal occurs in the order of the first ferromagnetic layer 1D, the first ferromagnetic layer 1E, and the first ferromagnetic layer 1F. For example, when a current having a certain amount of current flows through the spin-orbit torque wiring 20, only the first ferromagnetic layer 1D is subjected to the magnetization reversal. When an amount of current flowing through the spin-orbit torque wiring 20 is increased, the magnetization reversal occurs in the order of the first ferromagnetic layer 1E and the first ferromagnetic layer 1F. A resistance value of the spin-orbit-torque magnetoresistance effect element 105 is generated due to a change in magnetization state of the ferromagnetic layers (the magnetization fixed layer P and the first ferromagnetic layers 1D, 1E, and 1F) having the first non-magnetic layer 4 disposed therebetween. When the magnetizations of the first ferromagnetic layers 1D, 1E, and 1F are subjected to the magnetization reversal in a stepwise manner, the spin-orbit-torque magnetoresistance effect element 105 can record information in multiple values. Furthermore, since the first ferromagnetic layers 1D, 1E, and 1F are spatially separated, the influence of each of the magnetizations thereof is small Therefore, the spin-orbit-torque magnetoresistance effect element 105 can stably maintain each state of multiple values.

Although a case in which the three first ferromagnetic layers 1D, 1E, and 1F are provided has been described with reference to FIGS. 14 and 15, the number of first ferromagnetic layers is not limited. Furthermore, shapes and sizes of the first ferromagnetic layers 1D, 1E, and 1F need not be constant and may be different from each other.

Sixth Embodiment (Magnetic Memory)

Figure 16:
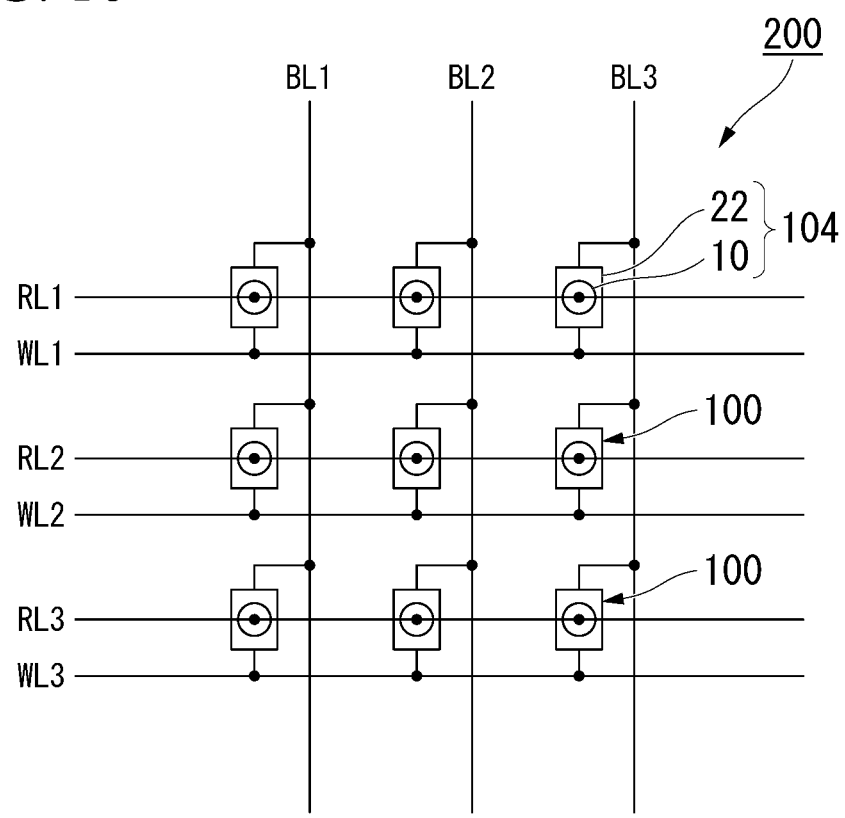
FIG. 16 is a plan view of a magnetic memory according to the fifth embodiment.

FIG. 16 is a schematic view of a magnetic memory 200 which includes a plurality of spin-orbit-torque magnetoresistance effect elements 104 (refer to FIG. 11). The magnetic memory 200 illustrated in FIG. 16 has a 3×3 matrix arrangement of spin-orbit-torque magnetoresistance effect elements 104. FIG. 16 is an example of a magnetic memory and a constitution, the number, and an arrangement of the spin-orbit-torque magnetoresistance effect element 104 are arbitrary.

One of word lines WL1 to WL3, one of bit lines BL1 to BL3, and one of read lines RL1 to RL3 are connected to each of the spin-orbit-torque magnetoresistance effect elements 104.

A writing operation is performed by selecting one of the word lines WL1 to WL3 and one of the bit lines BL1 to BL3 to which a current is applied and flowing a current through a spin-orbit torque wiring 22 of any of the spin-orbit-torque magnetoresistance effect elements 104. Furthermore, a reading operation is performed by selecting one of the read lines RL1 to RL3 and one of the bit lines BL1 to BL3 to which a current is applied and flowing the current through a laminate 10 of any of the spin-orbit-torque magnetoresistance effect elements 104 in a lamination direction thereof. One of the word lines WL1 to WL3, one of the bit line BL1 to BL3, and one of the read lines RL1 to RL3 to which a current is applied can be selected using a transistor or the like. That is to say, the disclosure can be used as a magnetic memory when data of any element is read from the plurality of spin-orbit-torque magnetoresistance effect elements 104.

Although the preferred embodiments of the disclosure have been described above in detail, the disclosure is not limited to the specific embodiments and various changes and modifications are possible without departing from the scope of the gist of the disclosure as set forth in the claims.

EXPLANATION OF REFERENCES 1, 1', 1A, 1B, 1C, 1D, 1E, 1F First ferromagnetic layer
1b1, 1Db1, 1Eb1, 1Fb1, 20b1, 21b1, 22b1, 23b1 First end
1b2, 1Db2, 1Eb2, 1Fb2, 20b2, 21b2, 22b2, 23b2 Second end
2 Second ferromagnetic layer
3 Third ferromagnetic layer
4 First non-magnetic layer
5 Second non-magnetic layer
10, 11, 12 Laminate
20, 21, 22, 23 Spin-orbit torque wiring
20a, 22a First surface
20A, 21A, 22A, 23A First virtual cross-section
20B, 21B, 22B, 23B Second virtual cross-section
20C Third virtual cross-section
20D Fourth virtual cross-section
20E Fifth virtual cross-section
20F Sixth virtual cross-section
101, 101A, 102, 102A, 103A, 103B, 103C Spin-orbit-torque magnetization rotational element
104, 104A, 104B, 105 Spin-orbit-torque magnetoresistance effect element
200 Magnetic memory
h1, h2 Thickness
np Narrow width portion
P, P1, P2 Magnetization fixed layer
S1 First spin
S2 Second spin
sp Start point
St, St1 Step
w1, w2 Width

What is claimed is:

1. A spin-orbit-torque magnetization rotational element, comprising:
a first ferromagnetic layer having:
a first end in a first direction;
a second end in the first direction; and
a narrow width portion whose width in a second direction orthogonal to the first direction is locally narrower between the first end and the second end when viewed in a plan view from a lamination direction of the first ferromagnetic layer; and
a spin-orbit torque wiring with a main constituent element that is a non-magnetic heavy metal or non-magnetic heavy metals, the spin-orbit torque wiring having:
a first surface that faces the first ferromagnetic layer and spreads along a reference plane orthogonal to the lamination direction;
a long axis that extends in the first direction when viewed in the plan view;
a first virtual cross-section which passes through the first end of the first ferromagnetic layer and is orthogonal to the first direction; and
a second virtual cross-section which passes through the second end of the first ferromagnetic layer and is orthogonal to the first direction, an area of the first virtual cross-section being different from an area of the second virtual cross-section.

2. The spin-orbit-torque magnetization rotational element according to claim 1,
wherein widths of the spin-orbit torque wiring in the second direction are different in the first virtual cross-section and the second virtual cross-section when viewed in the plan view.

3. The spin-orbit-torque magnetization rotational element according to claim 2,
wherein thicknesses of the spin-orbit torque wiring are different in the first virtual cross-section and the second virtual cross-section.

4. A spin-orbit-torque magnetoresistance effect element, comprising:
the spin-orbit-torque magnetization rotational element according to claim 2;
a magnetization fixed layer located on a side of the first ferromagnetic layer opposite to the spin-orbit torque wiring; and
a first non-magnetic layer located between the magnetization fixed layer and the first ferromagnetic layer.

5. The spin-orbit-torque magnetization rotational element according to claim 1,
wherein thicknesses of the spin-orbit torque wiring are different in the first virtual cross-section and the second virtual cross-section.

6. A spin-orbit-torque magnetoresistance effect element, comprising:
the spin-orbit-torque magnetization rotational element according to claim 5;
a magnetization fixed layer located on a side of the first ferromagnetic layer opposite to the spin-orbit torque wiring; and
a first non-magnetic layer located between the magnetization fixed layer and the first ferromagnetic layer.

7. The spin-orbit-torque magnetization rotational element according to claim 1,
wherein a plurality of the narrow width portions are provided between the first end and the second end.

8. A spin-orbit-torque magnetoresistance effect element, comprising:
the spin-orbit-torque magnetization rotational element according to claim 7;
a magnetization fixed layer located on a side of the first ferromagnetic layer opposite to the spin-orbit torque wiring; and a first non-magnetic layer located between the magnetization fixed layer and the first ferromagnetic layer.

9. A spin-orbit-torque magnetoresistance effect element, comprising:
the spin-orbit-torque magnetization rotational element according to claim 1;
a magnetization fixed layer located on a side of the first ferromagnetic layer opposite to the spin-orbit torque wiring; and
a first non-magnetic layer located between the magnetization fixed layer and the first ferromagnetic layer.

10. The spin-orbit-torque magnetoresistance effect element according to claim 9, further comprising:
a magnetic field application mechanism for applying a magnetic field from the first end toward the second end when the area of the first virtual cross-section is larger than the area of the second virtual cross-section and applying a magnetic field from the second end toward the first end when the area of the first virtual cross-section is smaller than the area of the second virtual cross-section.

11. The spin-orbit-torque magnetoresistance effect element according to claim 9,
wherein the magnetization fixed layer has a second ferromagnetic layer, a second non-magnetic layer, and a third ferromagnetic layer in this order from a position close to the first ferromagnetic layer,
a product of a saturation magnetization and a volume of the second ferromagnetic layer is larger than a product of a saturation magnetization and a volume of the third ferromagnetic layer,
orientation directions of the magnetizations in the second ferromagnetic layer and the third ferromagnetic layer are opposite to each other, and
the magnetization fixed layer applies a magnetic field from the second end toward the first end to the first ferromagnetic layer.

12. The spin-orbit-torque magnetoresistance effect element according to claim 11,
wherein the spin-orbit torque wiring has a spin Hall angle which has a positive polarity, and
the spin-orbit torque wiring mainly includes any metal element selected from the group consisting of those of Groups 8, 9, 10, 11, and 12.

13. The spin-orbit-torque magnetoresistance effect element according to claim 9,
wherein the magnetization fixed layer has a second ferromagnetic layer, a second non-magnetic layer, and a third ferromagnetic layer in this order from a position close to the first ferromagnetic layer,
a product of a saturation magnetization and a volume of the second ferromagnetic layer is smaller than a product of a saturation magnetization and a volume of the third ferromagnetic layer,
orientation directions of the magnetizations of the second ferromagnetic layer and the third ferromagnetic layer are opposite to each other, and
the magnetization fixed layer applies a magnetic field from the first end toward the second end to the first ferromagnetic layer.

14. The spin-orbit-torque magnetoresistance effect element according to claim 13,
wherein the spin-orbit torque wiring has a spin Hall angle which has a negative polarity, and
the spin-orbit torque wiring mainly includes any metal element selected from the group consisting of those of Groups 3, 4, 5, and 6.

15. A magnetic memory, comprising:
a plurality of the spin-orbit-torque magnetoresistance effect elements according to claim 9.

* * * * *